(12) United States Patent
Emerson et al.

(10) Patent No.: US 8,860,043 B2
(45) Date of Patent: Oct. 14, 2014

(54) LIGHT EMITTING DEVICE PACKAGES, SYSTEMS AND METHODS

(75) Inventors: David T. Emerson, Chapel Hill, NC (US); Christopher P. Hussell, Cary, NC (US); Sung Chul Joo, Raleigh, NC (US)

(73) Assignee: Cree, Inc., Durham, NC (US)

( * ) Notice: Subject to any disclaimer, the term of this patent is extended or adjusted under 35 U.S.C. 154(b) by 685 days.

(21) Appl. No.: 13/019,812

(22) Filed: Feb. 2, 2011

(65) Prior Publication Data
US 2011/0186873 A1 Aug. 4, 2011

Related U.S. Application Data

(63) Continuation-in-part of application No. 12/479,318, filed on Jun. 5, 2009, now Pat. No. 7,923,739, and a continuation-in-part of application No. 29/380,549, filed on Dec. 7, 2010, now Pat. No. Des. 648,687, and a continuation-in-part of application No. 12/969,267, filed on Dec. 15, 2010, now Pat. No. 8,686,445, and a continuation-in-part of application No. 13/011,609, filed on Jan. 21, 2011.

(51) Int. Cl.
*H01L 33/60* (2010.01)
*H01L 33/48* (2010.01)

(52) U.S. Cl.
CPC ............... *H01L 33/48* (2013.01); *H01L 33/60* (2013.01)
USPC .............................................. 257/88; 257/99

(58) Field of Classification Search
USPC ........................... 257/99, 791, 666; 29/592.1
See application file for complete search history.

(56) References Cited

U.S. PATENT DOCUMENTS

| | | | |
|---|---|---|---|
| 4,679,118 A | 7/1987 | Johnson et al. | |
| 4,946,547 A | 8/1990 | Palmour | |
| 5,200,022 A | 4/1993 | Kong | |
| 5,210,051 A | 5/1993 | Carter, Jr. | |
| RE34,861 E | 2/1995 | Davis et al. | |
| 5,393,993 A | 2/1995 | Edmond | |
| 5,506,446 A | 4/1996 | Hoffman et al. | |
| 5,523,589 A | 6/1996 | Edmond | |
| 6,274,924 B1 * | 8/2001 | Carey et al. | 257/676 |
| 6,498,355 B1 | 12/2002 | Harrah | |

(Continued)

FOREIGN PATENT DOCUMENTS

| | | |
|---|---|---|
| CN | 200930286397.5 | 10/2010 |
| CN | ZL 2011-30010728 | 1/2012 |

(Continued)

OTHER PUBLICATIONS

Notification Concerning Availability Of The Publication Serial No. PCT/US2012/024122 dated Aug. 16, 2012.

(Continued)

*Primary Examiner* — Roy Potter
(74) *Attorney, Agent, or Firm* — Jenkins, Wilson, Taylor & Hunt, P.A.

(57) ABSTRACT

Packages, systems and methods for light emitting devices are disclosed. An LED package in one aspect can be of various sizes and configurations and can include one or more LEDs of a size smaller than those typically provided. The LED package or packages can for example be used for backlighting or other lighting fixtures. Optimized materials and techniques can be used for the LED packages to provide energy efficiency and long lifetime.

80 Claims, 8 Drawing Sheets

(56) References Cited

U.S. PATENT DOCUMENTS

| | | | |
|---|---|---|---|
| 6,610,563 B1 | 8/2003 | Waitl | |
| 6,740,903 B2* | 5/2004 | Isoda | 257/81 |
| 6,806,583 B2* | 10/2004 | Koay et al. | 257/787 |
| 6,828,170 B2 | 12/2004 | Roberts et al. | |
| 6,936,855 B1 | 8/2005 | Harrah | |
| 6,943,433 B2 | 9/2005 | Kamada | |
| 6,949,771 B2* | 9/2005 | Yoganandan et al. | 257/99 |
| D514,073 S | 1/2006 | Suenaga | |
| 7,081,661 B2 | 7/2006 | Takehara et al. | |
| 7,224,047 B2 | 5/2007 | Carberry et al. | |
| 7,244,965 B2* | 7/2007 | Andrews et al. | 257/98 |
| D566,055 S | 4/2008 | Kim | |
| 7,361,940 B2 | 4/2008 | Kim et al. | |
| D573,113 S | 7/2008 | Bando | |
| D573,114 S | 7/2008 | Min et al. | |
| 7,400,049 B2 | 7/2008 | Shim | |
| 7,429,790 B2 | 9/2008 | Condie et al. | |
| 7,432,589 B2 | 10/2008 | Yamamoto et al. | |
| D580,375 S | 11/2008 | Yen | |
| D580,381 S | 11/2008 | Bando | |
| D580,891 S | 11/2008 | Sung et al. | |
| 7,456,499 B2 | 11/2008 | Loh et al. | |
| 7,462,870 B2 | 12/2008 | Nakashima | |
| D584,699 S | 1/2009 | Bando | |
| D594,827 S | 6/2009 | Loh et al. | |
| D595,675 S | 7/2009 | Wang et al. | |
| 7,564,180 B2 | 7/2009 | Brandes | |
| 7,566,159 B2 | 7/2009 | Oon et al. | |
| D597,968 S | 8/2009 | Kobayakawa et al. | |
| D597,971 S | 8/2009 | Kobayakawa et al. | |
| D598,400 S | 8/2009 | Bando | |
| 7,592,638 B2 | 9/2009 | Kim | |
| 7,659,551 B2 | 2/2010 | Loh | |
| D614,592 S | 4/2010 | Hussell et al. | |
| 7,692,206 B2 | 4/2010 | Loh | |
| D615,504 S | 5/2010 | Keller et al. | |
| 7,719,024 B2 | 5/2010 | Bando | |
| D621,798 S | 8/2010 | Lu et al. | |
| D621,799 S | 8/2010 | Hussell et al. | |
| D622,680 S | 8/2010 | Lin et al. | |
| 7,791,061 B2 | 9/2010 | Edmond et al. | |
| D626,095 S | 10/2010 | Hseih | |
| D627,310 S | 11/2010 | Lin et al. | |
| D628,541 S | 12/2010 | Lin | |
| 7,852,015 B1 | 12/2010 | Yen et al. | |
| D632,267 S | 2/2011 | Chen et al. | |
| D632,659 S | 2/2011 | Hseih | |
| D634,284 S | 3/2011 | Ko et al. | |
| D634,285 S | 3/2011 | Ko et al. | |
| D634,286 S | 3/2011 | Ko et al. | |
| D634,716 S | 3/2011 | Suzuki | |
| D635,527 S | 4/2011 | Hussell et al. | |
| 7,923,739 B2 | 4/2011 | Hussell | |
| D641,719 S | 7/2011 | Hussell et al. | |
| D643,819 S | 8/2011 | Joo | |
| D648,686 S | 11/2011 | Hussell et al. | |
| D648,687 S | 11/2011 | Joo et al. | |
| D658,599 S | 5/2012 | Takahashi et al. | |
| D659,657 S | 5/2012 | Hussell et al. | |
| D661,264 S | 6/2012 | Joo et al. | |
| D667,801 S | 9/2012 | Joo et al. | |
| 8,269,244 B2 | 9/2012 | Hussell | |
| 8,354,992 B2 | 1/2013 | Rumreich et al. | |
| D679,842 S | 4/2013 | Joo et al. | |
| 8,497,522 B2 | 7/2013 | Hussell | |
| 8,598,602 B2 | 12/2013 | Hussell | |
| 8,610,140 B2 | 12/2013 | Joo | |
| 2001/0045640 A1 | 11/2001 | Oida et al. | |
| 2002/0004251 A1 | 1/2002 | Roberts et al. | |
| 2004/0075100 A1 | 4/2004 | Bogner et al. | |
| 2004/0079957 A1 | 4/2004 | Andrews et al. | |
| 2004/0126913 A1 | 7/2004 | Loh | |
| 2005/0269587 A1 | 12/2005 | Loh et al. | |
| 2006/0043401 A1 | 3/2006 | Lee et al. | |
| 2006/0118808 A1 | 6/2006 | Ishidu et al. | |
| 2006/0157726 A1 | 7/2006 | Loh et al. | |
| 2006/0186418 A1 | 8/2006 | Edmond et al. | |
| 2006/0220050 A1 | 10/2006 | Higaki et al. | |
| 2007/0052074 A1 | 3/2007 | Hasegawa | |
| 2007/0057364 A1 | 3/2007 | Wang et al. | |
| 2007/0075325 A1 | 4/2007 | Baek et al. | |
| 2007/0114514 A1 | 5/2007 | Ito | |
| 2007/0262328 A1 | 11/2007 | Bando | |
| 2008/0006837 A1 | 1/2008 | Park et al. | |
| 2008/0023722 A1 | 1/2008 | Lee et al. | |
| 2008/0185605 A1 | 8/2008 | Wada et al. | |
| 2008/0258130 A1 | 10/2008 | Bergmann et al. | |
| 2008/0258162 A1 | 10/2008 | Koung et al. | |
| 2008/0278941 A1 | 11/2008 | Logan et al. | |
| 2008/0283849 A1 | 11/2008 | Imai | |
| 2008/0290353 A1 | 11/2008 | Medendorp et al. | |
| 2009/0008662 A1 | 1/2009 | Ashdown et al. | |
| 2009/0101921 A1 | 4/2009 | Lai | |
| 2009/0122533 A1 | 5/2009 | Brukilacchio | |
| 2009/0159905 A1 | 6/2009 | Chen | |
| 2009/0189178 A1 | 7/2009 | Kim et al. | |
| 2009/0267085 A1 | 10/2009 | Lee et al. | |
| 2009/0321779 A1 | 12/2009 | Kim et al. | |
| 2010/0059783 A1 | 3/2010 | Chandra | |
| 2010/0102345 A1 | 4/2010 | Kong et al. | |
| 2010/0133554 A1 | 6/2010 | Hussell | |
| 2010/0133578 A1 | 6/2010 | Pickard et al. | |
| 2010/0155748 A1 | 6/2010 | Chan et al. | |
| 2010/0163887 A1 | 7/2010 | Kim et al. | |
| 2010/0181582 A1 | 7/2010 | Li et al. | |
| 2010/0237360 A1 | 9/2010 | Kao et al. | |
| 2010/0270577 A1 | 10/2010 | Rulkens et al. | |
| 2011/0006658 A1 | 1/2011 | Chan | |
| 2011/0031865 A1 | 2/2011 | Hussell et al. | |
| 2011/0090711 A1 | 4/2011 | Kim | |
| 2011/0180827 A1 | 7/2011 | Hussell | |
| 2011/0316022 A1 | 12/2011 | Hussell | |
| 2012/0069560 A1 | 3/2012 | Miskin et al. | |
| 2012/0127720 A1 | 5/2012 | Hussell et al. | |
| 2012/0153317 A1 | 6/2012 | Emerson et al. | |
| 2013/0003375 A1 | 1/2013 | Hussell | |
| 2013/0011946 A1 | 1/2013 | Hussell | |

FOREIGN PATENT DOCUMENTS

| | | |
|---|---|---|
| CN | ZL201130171313.0 | 4/2012 |
| EP | 001242234 | 1/2011 |
| EP | 2 438 631 | 4/2012 |
| EP | 2 603 930 | 6/2013 |
| EP | 2 628 196 | 8/2013 |
| JP | D1102760 | 3/2001 |
| JP | 2002-280616 | 9/2002 |
| JP | 2005-179147 | 7/2005 |
| JP | 2005-209763 | 8/2005 |
| JP | 2007-108547 | 4/2007 |
| JP | 2008-091792 | 4/2008 |
| JP | 2008-098218 | 4/2008 |
| JP | 2008-103480 | 5/2008 |
| JP | 2008-545269 | 12/2008 |
| JP | D1346959 | 12/2008 |
| JP | 2009-016636 | 1/2009 |
| JP | 2010-034262 | 2/2010 |
| JP | 2010-205776 | 9/2010 |
| JP | 1416396 | 5/2011 |
| JP | 1431637 | 12/2011 |
| JP | 1433335 | 1/2012 |
| JP | D1433030 | 1/2012 |
| JP | 1441805 | 4/2012 |
| KR | 1020070000130 A | 1/2007 |
| KR | 10-0845856 | 7/2008 |
| KR | 1020090003378 A | 1/2009 |
| KR | 30-0681227 | 2/2013 |
| KR | 30-0697636 | 6/2013 |
| TW | 100305347 | 3/2012 |
| TW | D146222 | 4/2012 |
| TW | D148144 | 7/2012 |
| WO | WO 2006/059828 | 6/2006 |
| WO | WO 2007/126720 | 11/2007 |
| WO | WO 2008/021268 | 2/2008 |

(56) References Cited

FOREIGN PATENT DOCUMENTS

| WO | WO-2010/141215 | 3/2011 |
|----|----------------|--------|
| WO | WO 2012/005984 | 1/2012 |
| WO | WO 2012/021238 | 2/2012 |
| WO | WO 2012/050994 | 4/2012 |
| WO | WO 2012/100060 | 7/2012 |
| WO | WO 2012/106312 | 8/2012 |
| WO | WO 2012/109225 | 8/2012 |
| WO | WO 2012/151270 | 11/2012 |

OTHER PUBLICATIONS

Certificate of Design Patent for Chinese Application Serial No. CN ZL 201130171313 dated May 7, 2012.
Certificate of Design Patent for Application Serial No. CN ZL 201130210595 dated Jun. 11, 2012.
Certificate of Design Patent for Application Serial No. CN ZL 201030577293 dated Jun. 11, 2012.
International Search Report for Application Serial No. PCT/US2012/023285 dated Jun. 27, 2012.
International Search Report and Written Opinion for Application Serial No. PCT/US2012/024122 dated Jul. 11, 2012.
Korean Office Action for Application Serial No. KR 30-2010-0047048 dated Dec. 15, 2011.
Korean Office Action for Application Serial No. KR 30-2010-0047049 dated Dec. 15, 2011.
Korean Office Action for Application Serial No. KR 30-2011-27243 dated Jul. 5, 2012.
Korean Office Action for Application Serial No. KR 30-2011-27244 dated Jul. 5, 2012.
Korean Office Action for Application Serial No. KR 30-2011-27245 dated Jul. 5, 2012.
International Search Report and Written Opinion for Application Serial No. PCT/US2012/021879 dated Sep. 21, 2012.
International Search Report and Written Opinion for Application Serial No. PCT/US2012/036110 dated Oct. 4, 2012.
Notification Concerning Availability Of The Publication Serial No. PCT/US2012/023285 dated Aug. 9, 2012.
Korean Office Action for Application Serial No. KR 30-2010-0047049 dated Sep. 12, 2012.
Hyun-Ho Kim et al., Thermal Transient Characteristics of Die Attach in High Power LED PKG, Microelectronics Reliability, vol. 48, Issue 3, Mar. 2008, pp. 445-454.
Design U.S. Appl. No. 29/338,186, filed Jun. 5, 2009.
Co-pending U.S. Appl. No. 12/498,856, filed Jul. 7, 2009.
Design U.S. Appl. No. 29/353,652, filed Jan. 12, 2010.
Related CIP U.S. Appl. No. 12/969,267, filed Dec. 15, 2010 entitled "Solid State Lighting Devices and Methods" (Filed With Non-Publication Request).
Notice of Allowance for Design U.S. Appl. No. 29/360,791 dated Apr. 12, 2011.
Non-Final Office Action for Korean Application Serial No. KR 30-2010-0047048 dated Dec. 15, 2011.
Non-Final Office Action for Korean Application Serial No. KR 30-2010-0047049 dated Dec. 15, 2011.
Notice of Allowance for U.S. Appl. No. 29/401,692 dated Jan. 20, 2012.
Notice of Allowance for U.S. Appl. No. 29/403,433 dated Feb. 2, 2012
Taiwanese Office Action for Appl. No. 099305566 dated Jul. 12, 2011.
Notice of Allowance for Design U.S. Appl. No. 29/360,791 dated Jul. 21, 2011.
Notice of Allowance for Design U.S. Appl. No. 29/380,549 dated Jul. 28, 2011.
Description Model No. NS6x083x issued by Nichia Corporation—at least as early as Feb. 17, 2007.
Description Model No. NS6G083 issued by Nichia Corporation—at least as early as Aug. 31, 2007.
Notice of Allowance dated Apr. 16, 2010 from U.S. Appl. No. 29/338,186.
Design U.S. Appl. No. 29/360,791, filed Apr. 30, 2010.
Non-Final Office Action for U.S. Appl. No. 12/479,318 dated Jun. 2, 2010.
Related Design U.S. Appl. No. 29/365,939, filed Jul. 16, 2010.
U.S. Appl. No. 12/853,812, filed Aug. 10, 2010.
Notice of Allowance for U.S. Appl. No. 29/353,652 dated Aug. 24, 2010.
U.S. Appl. No. 61/404,985, filed Oct. 13, 2010.
Non-final Office Action for U.S. Appl. No. 12/479,318 dated Nov. 10, 2010.
Notice of Allowance for U.S. Appl. No. 29/353,652 dated Nov. 26, 2010.
Supplemental Notice of Allowance for U.S. Appl. No. 29/353,652 dated Dec. 8, 2010.
U.S. Appl. No. 12/969,267, filed Dec. 15, 2010.
Notice of Allowance for U.S. Appl. No. 29/360,791 dated Dec. 22, 2010.
Notice of Allowance for U.S. Appl. No. 29/365,939 dated Dec. 27, 2010.
Related Design U.S. Appl. No. 29/382,394, filed Jan. 3, 2011.
International Search Report/Written Opinion dated Jan. 5, 2011 for PCT/US2010/035379.
Certificate of Registration for Community Design Application Serial No. 001283600-0001-0003 dated Jan. 7, 2011.
U.S. Appl. No. 13/011,609, filed Jan. 21, 2011.
Supplemental Notice of Allowance for U.S. Appl. No. 29/360,791 dated Jan. 24, 2011.
Notice of Allowance for U.S. Appl. No. 12/479,318 dated Feb. 17, 2011.
Notice of Allowance for U.S. Appl. No. 29/338,186 dated Mar. 10, 2011.
Notice of Allowance for Japanese Design Appl. No. 2010-026186 dated Mar. 29, 2011.
Supplemental Notice of Allowability for U.S. Appl. No. 12/479,318 dated Apr. 5, 2011.
Japanese Office Action for JP2010-026185 dated Apr. 5, 2011.
Notice of Allowance for Design U.S. Appl No. 29/360,791 dated Apr. 12, 2011.
Notice of Allowance for Design U.S. Appl. No. 29/365,939 dated Apr. 12, 2011.
Supplemental Notice of Allowance for Design U.S. Appl. No. 29/338,186 dated May 20, 2011.
Office Action with Restriction/Election Requirement for U.S. Appl. No. 12/853,812 dated Sep. 22, 2011.
International Search Report and Written Opinion for PCT Application Serial No. PCT/US2011/41833 dated Oct 24, 2011.
International Search Report and Written Opinion for PCT Application Serial No. PCT/US2011/043539 dated Oct. 28, 2011.
Notice of Allowance for Japanese Application Serial No. JP-DES 2011/015199 dated Nov. 10, 2011.
Notice of Allowance for Japanese Application Serial No. JP-DES 2011/015200 dated Nov. 30, 2011.
Notice of Allowance for Japanese Application Serial No. JP-DES 2011/015201 dated Nov. 30, 2011.
Notice of Allowance for Taiwanese Application Serial No. TW 099305566 dated Dec. 5, 2011.
Notice of Allowance for Chinese Application Serial No. CN 2011/30171313.0 dated Dec. 6, 2011.
Non-Final Office Action for U.S. Appl. No. 12/853,812 dated Dec. 7, 2011.
International Preliminary Report on Patentability for PCT Application Serial No. PCT/US2010/035379 dated Dec. 8, 2011.
Notice of Allowance for U.S. Appl. No. 29/397,017 dated Dec. 9, 2011.
Notification of Grant for Chinese Application Serial No. CN 2011/30210595.0 dated Jan. 17, 2012.
Notification of Grant for Chinese Application Serial No. CN 2010-305787293.2 dated Jan. 19, 2012.
International Search Report for Application Serial No. TW 100305347 dated Mar. 5, 2012.
Japanese Notice of Allowance for Application Serial No. JP 2011-017747 dated Mar. 13, 2012.

(56) References Cited

OTHER PUBLICATIONS

Communication of European publication number and information on the application of Article 67(3) EPC dated Mar. 14, 2012.
Non-Final Office Action for U.S. Appl. No. 13/082,699 dated Apr. 13, 2012.
Notice of Allowance for U.S. Appl. No. 29/397,017 dated May 17, 2012.
Notice of Allowance for U.S. Appl. No. 12/853,812 dated May 21, 2012.
International Search Report and Written Opinion for U.S. Appl. No. PCT/US2011/054560 dated May 22, 2012.
Supplemental Notice of Allowance for U.S. Appl. No. 29/397,017 dated Jul. 23, 2012.
Extended European Search Report for Application No. EP 10 78 3782 dated Nov. 22, 2013.
Restriction Requirement for U.S. Appl. No. 13/953,438 dated Dec. 5, 2013.
Japanese Office Action for Application No. 2012-513966 dated Dec. 9, 2013.
Notice of Allowance for U.S. Appl. No. 29/451,761 dated Dec. 11, 2013.
Notice of Allowance from U.S. Appl. No. 29/330,657 dated Sep. 25, 2009.
Taiwanese Notice of Allowance for Application No. 100305347 dated Mar. 23, 2012.
Restriction Requirement for U.S. Appl. No. 29/382,394 dated Jul. 17, 2012.
Notice of Allowance for U.S. Appl. No. 13/082,699 dated Oct. 23, 2012.
Korean Decision to Grant for Application No. KR 30-2011-0027245 dated Nov. 19, 2012.
Korean Decision to Grant for Application No. KR 30-2011-0027244 dated Nov. 19, 2012.
Korean Decision to Grant for Application No. KR 30-2011-0027243 dated Nov. 26, 2012.
Korean Decision to Grant for Application No. KR 30-2010-0047048 dated Nov. 26, 2012.
Notice of Allowance for U.S. Appl. No. 29/382,394 dated Nov. 27, 2012.
Supplemental Notice of Allowance for U.S. Appl. No. 29/382,394 dated Jan. 14, 2013.
Non-Final Office Action for U.S. Appl. No. 13/462,450 dated Jan. 15, 2013.
Non-Final Office Action for U.S. Appl. No. 12/825,075 dated Feb. 1, 2013.
Non-Final Office Action for U.S. Appl. No. 13/227,961 dated Mar. 26, 2013.
Non-Final Office Action for U.S. Appl. No. 12/969,267 dated Mar. 29, 2013.
Notice of Allowance for U.S. Appl. No. 13/082,699 dated Apr. 3, 2013.
Korean Notice of Allowance for Application No. 30-2010-0047049 dated Apr. 4, 2013.
Non-Final Office Action for U.S. Appl. No. 13/011,609 dated Jun. 7, 2013.
Non-Final Office Action for U.S. Appl. No. 13/616,759 dated Jul. 11, 2013.
Notice of Allowance for U.S. Appl. No. 12/825,075 dated Jul. 31, 2013.
Notice of Allowance for U.S. Appl. No. 13/462,450 dated Aug. 1, 2013.
Non-Final Office Action for U.S. Appl. No. 13/362,683 dated Sep. 9, 2013.
Notice of Allowance for U.S. Appl. No. 29/432,988 dated Sep. 10, 2013.
Restriction Requirement for U.S. Appl. No. 29/451,761 dated Sep. 25, 2013.
Notice of Allowance for U.S. Appl. No. 13/227,961 dated Oct. 2, 2013.
Notice of Allowance for U.S. Appl. No. 12/969,267 dated Oct. 2, 2013.
Non-Final Office Action for U.S. Appl. No. 13/616,759 dated Oct. 10, 2013.

* cited by examiner

LIGHT EMITTING DEVICE PACKAGES, SYSTEMS AND METHODS

CROSS REFERENCE TO RELATED APPLICATIONS

This application relates and claims priority to and is a continuation-in-part application from these related matters: U.S. utility patent application Ser. No. 12/479,318, filed Jun. 5, 2009 now U.S. Pat. No. 7,923,739; U.S. design patent application Ser. No. 29/380,549, filed Dec. 7, 2010 now U.S. Pat. No. Des. 648,687; U.S. utility patent application Ser. No. 12/969,276 filed Dec. 15, 2010 now U.S. Pat. No. 8,686,445; and co-pending U.S. utility patent application Ser. No. 13/011,609, filed Jan. 21, 2011, the entire contents of all of which are hereby incorporated by reference herein.

TECHNICAL FIELD

The subject matter disclosed herein relates generally to light emitting device packages, systems, and methods. More particularly, the subject matter disclosed herein relates to light emitting diode (LED) packages, systems and methods with optimized components and proportions.

BACKGROUND

Solid state light sources, such as light emitting diodes (LEDs) are widely used in flat display panels for monitors, televisions, and/or other displays. LEDs can be used in the design of thinner, energy-saving backlighting systems for use with liquid crystal display (LCD) devices. Backlighting and/or other display panel systems using LEDs require less power to meet the brightness specifications for backlighting applications, thereby significantly reducing energy consumption and the need for active cooling systems. Conventional backlighting displays typically include a plurality of LEDs or LED packages mounted over an illumination panel. Conventional LED packages used in backlighting can comprise one or more large LED chips mounted in packages with a large thickness in combination with smaller cavity depth to thickness ratios. That is, cavity depth of conventional packages can comprise a small percentage of the overall thickness. A current need in display panel system technologies exists for thinner LED packages capable of maintaining brightness specifications for the manufacture and market of thinner, lighter products to consumers. Further need exists for thinner packages where the cavity depth is a larger percentage of the package to maintain reflection of light, thus, maintaining brightness levels. Conventional LED packages used in backlighting can also utilize silicone, epoxy or solder die attach. Such die attach methods can result in the LEDs becoming at least partially detached from the package during operation or experience squeeze out of the bonding materials. Such defects can lead to light failure and/or thermal breakdown of the LEDs during operation.

Despite the availability of various light emitting device packages in the marketplace, a need remains for LED packages, systems and methods with optimized components and proportions versus those currently available.

SUMMARY

In accordance with this disclosure, light emitting device packages, systems, and methods are provided with optimized components and proportions. It is, therefore, an object of the present disclosure herein to provide thin, bright light emitting device packages utilizing robust die attach methods.

These and other objects of the present disclosure as can become apparent from the disclosure herein are achieved, at least in whole or in part, by the subject matter described herein.

BRIEF DESCRIPTION OF THE DRAWINGS

A full and enabling disclosure of the present subject matter including the best mode thereof to one of ordinary skill in the art is set forth more particularly in the remainder of the specification, including reference to the accompanying figures, in which.

DETAILED DESCRIPTION

Figure 1:
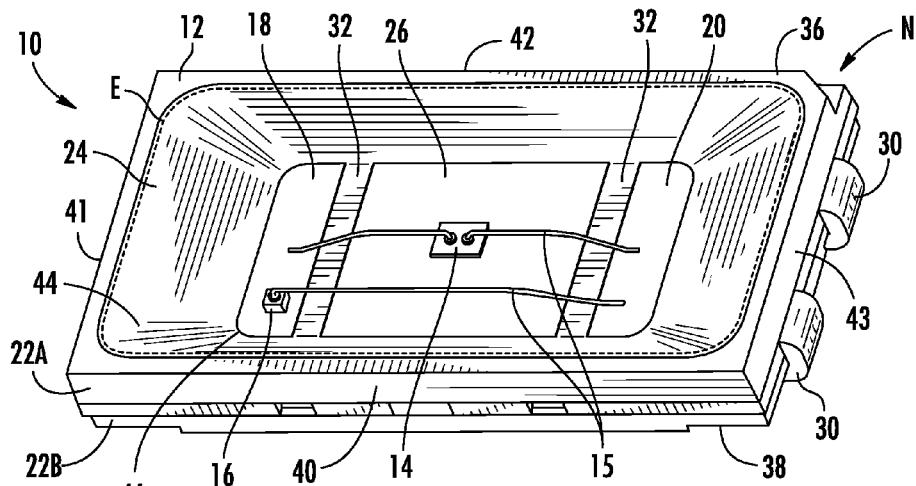
FIG. 1 illustrates a perspective top view of an embodiment of an LED package according to the subject matter herein.

Reference will now be made in detail to possible aspects or embodiments of the subject matter herein, one or more examples of which are shown in the figures. Each example is provided to explain the subject matter and not as a limitation. In fact, features illustrated or described as part of one embodiment can be used in another embodiment to yield still a further embodiment. It is intended that the subject matter disclosed and envisioned herein covers such modifications and variations.

As illustrated in the various figures, some sizes of structures or portions are exaggerated relative to other structures or portions for illustrative purposes and, thus, are provided to illustrate the general structures of the present subject matter. Furthermore, various aspects of the present subject matter are described with reference to a structure or a portion being formed on other structures, portions, or both. As will be appreciated by those of skill in the art, references to a structure being formed "on" or "above" another structure or portion contemplates that additional structure, portion, or both may intervene. References to a structure or a portion being formed "on" another structure or portion without an intervening structure or portion are described herein as being formed "directly on" the structure or portion. Similarly, it will be understood that when an element is referred to as being "connected", "attached", or "coupled" to another element, it can be directly connected, attached, or coupled to the other element, or intervening elements may be present. In contrast, when an element is referred to as being "directly connected", "directly attached", or "directly coupled" to another element, no intervening elements are present.

Furthermore, relative terms such as "on", "above", "upper", "top", "lower", or "bottom" are used herein to describe one structure's or portion's relationship to another structure or portion as illustrated in the figures. It will be understood that relative terms such as "on", "above", "upper", "top", "lower" or "bottom" are intended to encompass different orientations of the device in addition to the orientation depicted in the figures. For example, if the device in the figures is turned over, structure or portion described as "above" other structures or portions would now be oriented "below" the other structures or portions. Likewise, if devices in the figures are rotated along an axis, structure or portion described as "above", other structures or portions would now be oriented "next to" or "left of" the other structures or portions. Like numbers refer to like elements throughout.

Light emitting devices according to embodiments described herein may comprise group III-V nitride (e.g., gallium nitride) based light emitting diodes (LEDs) or lasers fabricated on a growth substrate, for example, silicon carbide substrate, such as those devices manufactured and sold by Cree, Inc. of Durham, N.C. For example, Silicon carbide (SiC) substrates/layers discussed herein may be 4H polytype silicon carbide substrates/layers. Other silicon carbide candidate polytypes, such as 3C, 6H, and 15R polytypes, however, may be used. Appropriate SiC substrates are available from Cree, Inc., of Durham, N.C., the assignee of the present subject matter, and the methods for producing such substrates are set forth in the scientific literature as well as in a number of commonly assigned U.S. patents, including but not limited to U.S. Pat. No. Re. 34,861; U.S. Pat. No. 4,946,547; and U.S. Pat. No. 5,200,022, the disclosures of which are incorporated by reference herein in their entireties.

As used herein, the term "Group III nitride" refers to those semiconducting compounds formed between nitrogen and one or more elements in Group III of the periodic table, usually aluminum (Al), gallium (Ga), and indium (In). The term also refers to binary, ternary, and quaternary compounds such as GaN, AlGaN and AlInGaN. The Group III elements can combine with nitrogen to form binary (e.g., GaN), ternary (e.g., AlGaN), and quaternary (e.g., AlInGaN) compounds. These compounds may have empirical formulas in which one mole of nitrogen is combined with a total of one mole of the Group III elements. Accordingly, formulas such as $Al_xGa_{1-x}N$ where $1>x>0$ are often used to describe these compounds. Techniques for epitaxial growth of Group III nitrides have become reasonably well developed and reported in the appropriate scientific literature, and in commonly assigned U.S. Pat. No. 5,210,051, U.S. Pat. No. 5,393,993, and U.S. Pat. No. 5,523,589, the disclosures of which are hereby incorporated by reference herein in their entireties.

Although various embodiments of LEDs disclosed herein comprise a growth substrate, it will be understood by those skilled in the art that the crystalline epitaxial growth substrate on which the epitaxial layers comprising an LED are grown may be removed, and the freestanding epitaxial layers may be mounted on a substitute carrier substrate or submount which may have better thermal, electrical, structural and/or optical characteristics than the original substrate. The subject matter described herein is not limited to structures having crystalline epitaxial growth substrates and may be used in connection with structures in which the epitaxial layers have been removed from their original growth substrates and bonded to substitute carrier substrates.

Group III nitride based LEDs according to some embodiments of the present subject matter, for example, may be fabricated on growth substrates (such as a silicon carbide substrates) to provide horizontal devices (with both electrical contacts on a same side of the LED) or vertical devices (with electrical contacts on opposite sides of the LED). Moreover, the growth substrate may be maintained on the LED after fabrication or removed (e.g., by etching, grinding, polishing, etc.). The growth substrate may be removed, for example, to reduce a thickness of the resulting LED and/or to reduce a forward voltage through a vertical LED. A horizontal device (with or without the growth substrate), for example, may be flip chip bonded (e.g., using solder) to a carrier substrate or printed circuit board (PCB), or wire bonded. A vertical device (without or without the growth substrate) may have a first terminal solder bonded to a carrier substrate, mounting pad, or PCB and a second terminal wire bonded to the carrier substrate, electrical element, or PCB. Examples of vertical and horizontal LED chip structures are discussed by way of example in U.S. Publication No. 2008/0258130 to Bergmann et al. and in U.S. Publication No. 2006/0186418 to Edmond et al., the disclosures of which are hereby incorporated by reference herein in their entireties.

Solid state light LEDs may be used individually or in combinations, optionally together with one or more luminescent materials (e.g., phosphors, scintillators, lumiphoric inks) and/or filters, to generate light of desired perceived colors (including combinations of colors that may be perceived as white). Inclusion of luminescent (also called lumiphoric) materials in LED devices may be accomplished by adding such materials to encapsulants, adding such materials to lenses, or by direct coating onto LEDs. Other materials, such as dispersers and/or index matching materials may be disposed in such encapsulants.

The LED can be coated, at least partially, with one or more phosphors with the phosphors absorbing at least a portion of the LED light and emitting a different wavelength of light such that the LED emits a combination of light from the LED and the phosphor. In one embodiment, the LED emits a white light combination of LED and phosphor light. The LED can be coated and fabricated using many different methods, with one suitable method being described in U.S. patent application Ser. Nos. 11/656,759 and 11/899,790, both entitled "Wafer Level Phosphor Coating Method and Devices Fabricated Utilizing Method", and both of which are incorporated herein by reference. In the alternative, LEDs can be coated using other methods such an electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED devices and methods according to the present subject matter can also have multiple LEDs of different colors, one or more of which may be white emitting.

Referring now to FIGS. 1 to 16, FIGS. 1 to 5 illustrate a first embodiment of a light emitting device package, for example an LED package, generally designated 10. Referring to FIGS. 1 to 4, LED package 10 can comprise a body structure, or body 12, housing one or more LED chips, or LEDs 14 arranged over an upper surface of a thermal element described further herein. An electrostatic discharge (ESD) protection device 16 can be disposed in the LED package 10 to protect the package from ESD damage. In one aspect, ESD protection device 16 can comprise a Zener diode, ceramic capacitor, transient voltage suppression (TVS) diode, multi-layer varistor, a Shottky diode, a different LED arranged reverse biased to LEDs 16 and/or any other suitable ESD protection device known in the art. ESD protection device 16 can be mounted over an electrical element and electrically connected to a second electrical element of a different electrical polarity. For example, first and second electrical elements can comprise first and second electrical leads 18 and 20, respectively. One of first and second electrical leads 18 and 20 can comprise an anode, and the other a cathode for allowing electrical signal, or current, to flow into the LED package and illuminate the one or more LEDs 14 when connected to an external circuit or other suitable source of electrical current. First and second electrical leads 18 and 20 can be formed of any suitable electrically conducting material. In one aspect, first and second electrical leads 18 and 20 can be formed from a leadframe comprising a single metal and/or layers of metals, for example including but not limited to, silver, copper, platinum, nickel, and/or any combination thereof.

Figure 3:
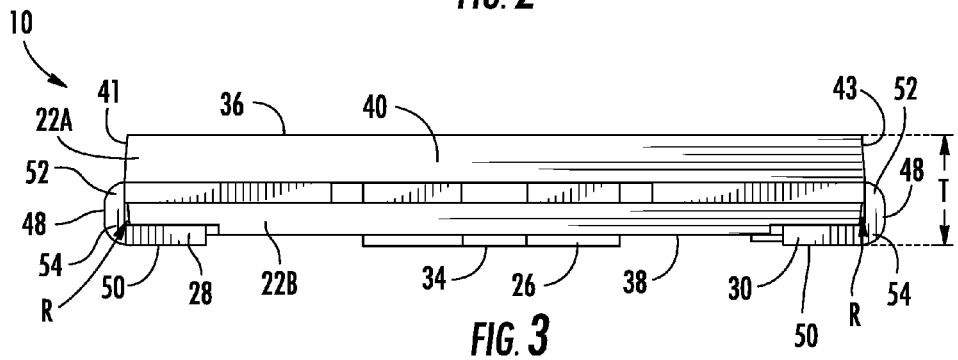
FIG. 3 illustrates a side view of an embodiment of an LED package according to the subject matter herein.

Body 12 can be advantageously formed using a molding process, such as injection molding, using a thermoplastic and/or thermoset material that can be electrically insulating. Polymer-containing materials can be used to form the body 12, with such materials optionally being reinforced (e.g., with fibers, ceramics, or composites). Body 12 can be white or light in color to minimize dark appearance of the overall package. Ceramic and/or composite materials may be utilized in place of polymers to form body 12 in certain embodiments. As an alternative to injection molding, other types of molding and/or forming processes (e.g., sintering) may be used. Body 12 can comprise an upper portion 22A and lower portion 22B (e.g., as may be formed in upper and lower molding die portions (not shown), respectively). A reflector cavity 24 can be formed about electrical elements and thermal element as the inverse of a central protrusion in an upper molding die. In one aspect, thermal element can comprise a thermal heat transfer material 26 over which the one or more LEDs 14 can be directly and/or indirectly mounted. As FIG. 3 illustrates, lower portion 22B can taper inwardly and away from the external portions of the metal leads, for example, one or more external portions 28 corresponding to first electrical lead 18 and one or more external portions 30 corresponding to second electrical lead 20.

Body 12 can comprise a body selected from a group of materials consisting of molded plastic, polymeric, thermoset plastic, thermoplastic, ceramic, nylon, liquid crystal polymer (LCP), or polyvinyl chloride (PVC) wherein body 12 can be disposed around thermal and electrical elements. In one aspect, body 12 can comprise a white plastic material, more specifically, a molded white plastic material. In one aspect, body 12 can comprise any suitable moldable material. In another aspect, body 12 can comprise a plastic material having quantitative and qualitative properties optimized for solid state device package applications. The plastic material can in one aspect comprise, for example, any suitable organic polymer, such as for example a heat resistant resin such as a polyamide resin. The plastic material can be filled with glass or mineral material for strength and something like titanium dioxide for reflectivity.

Utilizing a plastic material such as described herein for body 12 of package 10 can allow for an advantageous softness for body 12 at operating temperatures as hardness can depend upon temperature. This softness allows body 12 to desirably have improved reliability and useful lifetime. The plastic material can in one aspect be a liquid crystal polymer (LCP). An optimized plastic material in accordance herewith can have a glass transition temperature ($T_g$) that can, for example, be greater than approximately 110 degrees Celsius (° C.). The glass transition temperature ($T_g$) can, for example, be greater than approximately 115° C. or greater than approximately 120° C. In one aspect, the glass transition temperature ($T_g$) can be greater than approximately 123° C. The optimized plastic material in accordance herewith can also comprise a melting point temperature ($T_m$) that can be less than approximately 315° C. The melting point temperature ($T_m$) can, for example, be less than approximately 310° C. The melting point temperature ($T_m$) can, for example, be less than approximately 300° C. In one aspect, the melting point temperature ($T_m$) can be approximately 307° C. A plastic material with a $T_g$ of approximately 123° C. is higher than many plastics conventionally used and can allow the package to have increased stability at elevated temperatures. A plastic material with a lower $T_m$ of approximately 307° C. can allow better flowability because the melting temperature is lower than that of plastics conventionally used and the plastic body is easier to mold. The plastic selected for body 12 can also comprise optimized qualitative properties. For example, a white plastic material can be chosen which exhibits a better reflectivity retention value while also exhibiting fewer tendencies to discolor, degrade, and/or yellow when subjected to heat and/or light exposure. The reflectivity of the plastic material can in one aspect be greater than 90% for example, and that level or another level of high reflectivity can be maintained over time, heat, moisture, and blue light exposure.

Other characteristics, or features of the plastic material for body 12 can comprise an elongation value (mechanical property) of approximately 1.4% or greater, or an elongation value of 1.6% or greater. In one aspect, the elongation value can be approximately 1.5% or greater. Also as a mechanical property, the flexural strength of the plastic material of body 12 as measured by ASTM D790 standards can be approximately 150 MPa or lower, approximately 130 MPa or lower, or approximately 120 MPa or lower. In one aspect, the flexural strength of the plastic material of body 12 can be approximately 140 MPa or lower as measured by ASTM D790 standards. Also as a mechanical property, the flexural modulus of the plastic material of body 12 can be approximately 6.9 GPa or lower, or approximately 6.5 GPa or lower. In one aspect, the flexural modulus of the plastic material of body 12 can be approximately 6.0 GPa or lower. As yet another mechanical property, the tensile strength of the plastic material of body 12 can be approximately 100 MPa or lower as measured by ASTM D638 standards, approximately 90 MPa or lower, or approximately 80 MPa or lower. In one aspect, the tensile strength of the plastic material of body 12 can be less than approximately 75 MPa as measured by ASTM D638 standards.

Still referring to FIGS. 1 to 5, body 12 can comprise an upper surface 36, a lower surface 38 and one or more lateral and exterior side walls. A sign or indicator can be disposed in at least one portion of upper surface 36 to indicate the polarity of the package. For example, a notch N can be disposed in an upper corner to indicate the cathode and/or anode side of LED package 10 and can also be useful in processing if desired. In one aspect, body 12 can comprise four lateral walls 40, 41, 42, and 43. Lateral walls 40-43 can comprise the same or different lengths. In one aspect, lateral walls can form a substantially square, rectangular, circular or any other suitably shaped package body 12 and corresponding footprint. For illustration purposes, a rectangular package 10 is illustrated wherein opposing lateral walls comprise substantially the same length. For example, first lateral wall 40 and opposing third lateral wall 42 can comprise substantially the same or similar length which can be longer than one or more adjacent lateral walls. Likewise, second lateral wall 41 and opposing fourth lateral wall 43 can comprise substantially the same or similar length which can be shorter than one or more adjacent lateral walls. Second and fourth lateral walls 41 and 43, respectively, can be disposed and adjacent first and third lateral walls 40 and 42, respectively.

Body 12 can, as mentioned previously, further define reflector cavity 24. Reflector cavity 24 can comprise substantially the same shape as lateral walls 40-43 or any other suitable shape. For example, reflector cavity 24 can comprise a substantially square, rectangular, circular, or any other suitably shaped cavity. For illustration purposes only and without limitation, reflector cavity 24 is shown as a substantially rectangular cavity having substantially curved corners 44 connecting one or more adjacent walls. Corners 44 could optionally comprise substantially squared corners or any other suitable shape. Reflector cavity 24 can comprise two opposing walls that can be longer in length than adjacent walls. Reflector cavity 24 can be defined at the upper surface 36 of body 12 and can extend to a cavity floor 46. Reflector cavity can be disposed or inclined at an angle between the upper surface 36 and cavity floor 46. Cavity floor 46 can be substantially flush with thermal and electrical elements, or can be at least partially disposed above and/or below such elements. Cavity floor 46 can comprise a portion of body 12 which can be configured in any suitable configuration to electrically and/or thermally isolate portions of the thermal and electrical elements. In one aspect, the thermal element can be fully electrically and/or thermally isolated from electrical elements. Specific dimensions of body 12 are illustrated and discussed with respect to FIG. 7 below.

Referring to FIGS. 1-5, LED package 10 can comprise one or more electrical and thermal elements. Electrical elements can comprise electrical leads 18 and 20 which can further comprise integrally formed and extending, external portions 28 and 30. The thermal element can comprise a heat transfer material 26 or a heat transferring substrate, such as for example a heat slug disposed on a bottom floor of reflector cavity 24 of package body 12. Reflector cavity 24 can optionally be coated with a reflecting substance and/or filled to a desired level with an encapsulant E. In FIG. 1, the dotted line illustrates a first level to which encapsulant E may be filled within reflector cavity 24. That is, encapsulant E can be filled to a level substantially flush with the top of reflector cavity 24, or in the alternative it may be filled to any suitable level within reflector cavity 24 and can comprise a concave or convex surface and even exceed or extend above reflector cavity 24 as known in the art. Encapsulant E can comprise any suitable material known in the art and can optionally comprise a phosphor or a lumiphor to interact with light emitted by the LEDs 14 and responsively emit light of a different wavelength spectrum.

Figure 14:
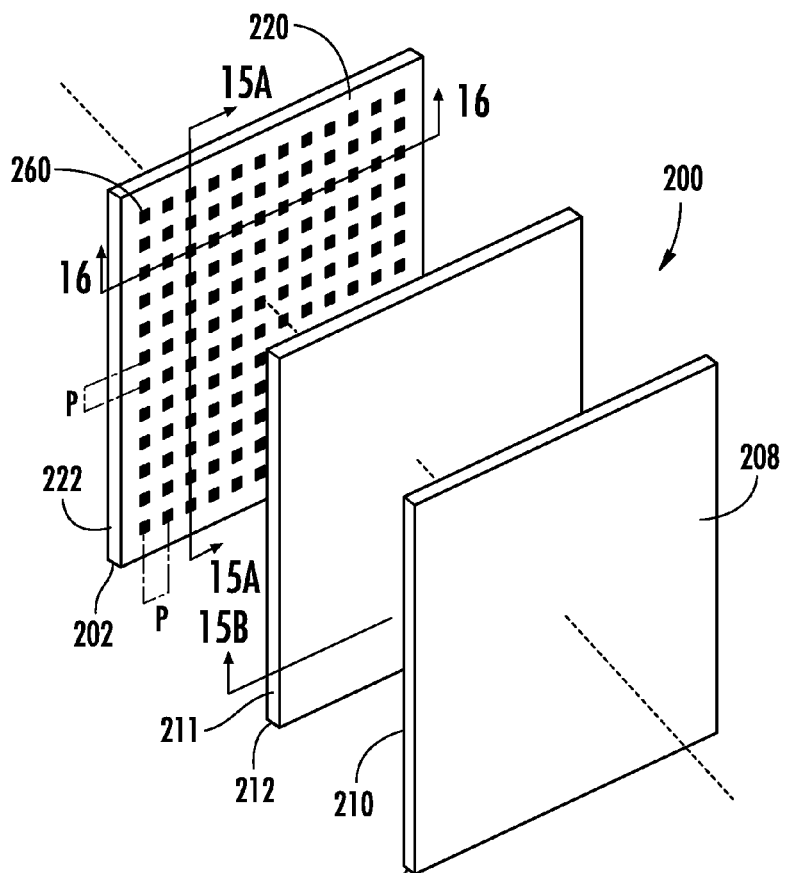
FIG. 14 illustrates a LED backlighting system according to the subject matter herein.

Heat transfer material 26 can comprise a single metal, an alloyed metal, and/or combinations or layers thereof. Heat transfer material 26 can comprise any suitable thermally conducting material known in the art. Heat transfer material 26 can be formed integrally as one piece or, in the alternative it can comprise several portions, for example a protruding portion 162 (FIG. 12A) attached to and extending from a base portion of thermally conducting material assembled together as known in the art. Heat transfer material 26 can comprise any suitable type of heat transfer device. In one aspect, heat transfer material 26 can be an intermediary thermal structure for transferring heat to another structure such as a heat transfer layer or a heat sink of an external source (not shown) for further heat dissipation. External sources can comprise, for example, a PCB, metal-core printed circuit board (MCPCB), or other suitable source or substrate. In some aspects, external source can comprise a substrate of a backlighting system or other display panel system such as illustrated in FIGS. 14-16. In one aspect, heat transfer material 26 can comprise a thermal structure with limited heat capacity and capable of heating up quite quickly if not effectively connected thermally to a further heat transfer device such as an actual heat sink.

Wirebonding the LEDs 14 and ESD protection device 16 using one or more conducting wires 15 can electrically connect the LEDs 14 and ESD protection device 16 to electrical elements. In some aspects, LEDs 14 and ESD protection device 16 can be reverse wirebonded (FIG. 11) for facilitating thinner packages and packages having shallower reflector cavity depths contributing to thinner packages. Heat transfer material 26 can be at least partially electrically and/or thermally isolated from electrical elements of the package. In one aspect, heat transfer material 26 can be fully electrically and/or thermally isolated from metal leads 18 and 20 by one or more insulating portions 32 of body 12. An exposed lower surface 34 of heat transfer material 26 can extend from the lower surface 38 of body 12. Exposed lower surface 34 can be flush with lower surfaces of external portions of metal leads 28 and 30. Heat transfer material 26 can conduct heat away from LEDs 14 and LED package 10 thereby allowing improved heat dissipation therefrom. In one aspect, the one or more LEDs 14 can be mounted on an optional submount (not shown) arranged between the LEDs and heat transfer material 26.

Electrical elements can comprise first and second electrical leads 18 and 20 formed from a leadframe which can serve as anode and cathode connections supplying the LEDs 14 with current sufficient for illuminating the LEDs. In one aspect, electrical leads 18 and 20 can comprise a metal or any other suitable electrically conducting material known in the art. First electrical lead 18 can comprise one or more external portions 28 extending from body 12. Second electrical lead 20 can comprise one or more external portions 30 extending from body 12 at opposing lateral sides, for example, second and fourth lateral sides 41 and 43, respectively. Each of the external portions 28 and 30 can comprise mirror images or different configurations. For illustration purposes, external portions 28 and 30 are shown as mirror images. External portions 28 and 30 can comprise vertical portions 48 extending external the lateral sides of body 12. In one aspect, external portions can extend from opposing lateral faces of the body outward from a center portion of the package. Each vertical portion 48 can extend from body 12 at a lateral exterior face and transition into a linear portion 50 which can extend below lower surface 38 of body 12 and turn in towards thermal element 26. When external portions 28 and 30 are disposed on opposing sides, linear portions 50 can turn in towards and face each other. A first bend 52 can be disposed adjacent lateral side walls where external portions 28 and 30 first protrude from LED package 10. Each vertical portion 48 can transition to form linear portion 50 at a second bend 54. Second bends 54 can be disposed below vertical portion 48 and can perpendicularly transition the vertical portion 48 into the linear portion 50. This configuration can be referred to as a "J-bend" type lead component. Linear portion 50 can electrical connect with and external source when soldered or otherwise suitably connected. For illustration purposes the J-bend lead component is illustrated, however, any suitable configuration of lead components is contemplated herein. External portions 28 and 30 can be soldered or otherwise connected to an electrical current source and external heat sink to permit operation of the one or more LEDs 14.

Referring to FIG. 3, one or more recesses R can be defined in exterior side walls of the body 12 adjacent to (e.g., below) locations where the external portions of the leads 28 and 30 extend through the exterior side walls. Such recesses R can be disposed in lower portion 22B of the body and can taper inwardly towards the heat transfer material 26 and below the first bends 52 in external portions 28 and 30 of the leads. Each recess R can have a depth relative to the corresponding exterior side wall, for example, lateral walls 41 and 43, with the depth of each recess R preferably being at least as large as an average thickness of the electrical leads. Recesses R can provide multiple benefits. First, the recesses R can eliminate presence of material immediately disposed below the first bends 52 thereby reducing stress applied to the body 12 when the first bends 52 are formed after the leadframe 100 (FIG. 8) is retained in the body 12. Second, recesses R can enable each first bend 52 to have a tighter bending radius and reduce or eliminate outward extension of the bent portions 52 thereby reducing the effective footprint of LED package 10. A smaller footprint can enable LED packages such as package 10 to be mounted at higher densities over an external substrate, for example a panel for a panel display system. LED packages 10 can optionally be overlaid with a Lambertian reflector or diffuser having reduced hole spacing (e.g., within a backlit display device, such as a LCD display), thereby enhancing lighting performance such as by enabling higher flux density and/or greater lighting uniformity.

FIG. 3 further illustrates package thickness T as measured from upper surface 36 of LED package body 122 to a lower surface of linear portion 50 of the electrical leads. Package thickness T can have any suitable thickness. In one aspect, thickness T can be optimized and be a thin package, such as for example and without limitation, substantially equal to or less than 0.86 mm. Thickness can be optimized by maintaining industry standard brightness levels and heat dissipation by retaining a somewhat thick heat transfer material 26, for example a 0.5 mm thick heat transfer material, and optimizing the cavity space in which LED 14 can be disposed. For example, a depth of reflector cavity 24 can be reduced by using smaller chips and/or reverse wirebonding. The package thickness T dimension can at least partially have a thickness dimension of the reflector cavity 24 and the LED 14 thickness disposed therein. In addition, the package thickness T dimension can at least partially correspond to a measurement of the heat transfer material 26.

Figure 4:
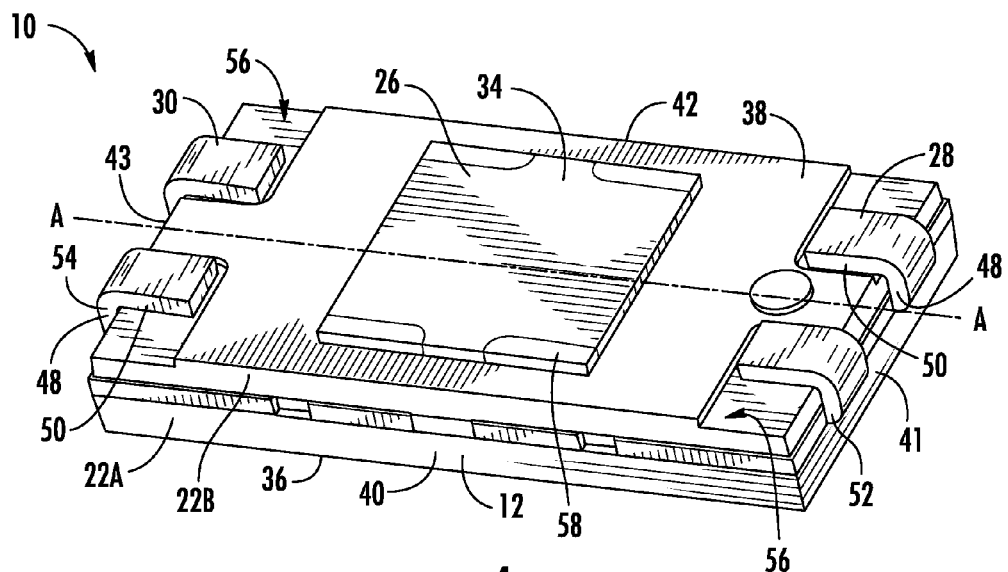
FIG. 4 illustrates a perspective bottom view of an embodiment of a LED package according to the subject matter herein.

FIG. 4 illustrates a bottom view of LED package 10 and exposed lower surface 34 of heat transfer material 26. Lower surface 38 of body 12 can comprise one or more recessed portions, generally designated 56 which can be disposed below external portions 28, 30 of electrical leads 18 and 20. Recessed portions 56 can allow overflow of attachment material, for example solder and/or flux, to move into recessed portion 56 when attaching LED package 10 to an external substrate, for example, a substrate used in backlighting and/or panel display systems. In some instances, at least a portion of body 12 can mold about at portion of heat transfer material 26. For example, FIG. 4 illustrates one or more corner portions 58 of the heat transfer area having body material molded or otherwise disposed over and/or adjacent heat transfer material 26. External portions 28 and 30 of electrical leads 18 and 20, respectively, can be disposed inboard of a corner of LED package 10. For example, external portions 28 and 30 of electrical leads 18 and 20, respectively, can comprise at least two external portions disposed on either side of a central axis A of package 10 and can extend inwardly towards heat transfer material 26 and towards each other. In one aspect, LED package 10 can comprise at least two external portions 28 and 30 extending per lateral side which can bend such that each external portion is disposed and extended over lower surface 38 of package and can be at least partially disposed in recessed portions 56.

Figure 2:
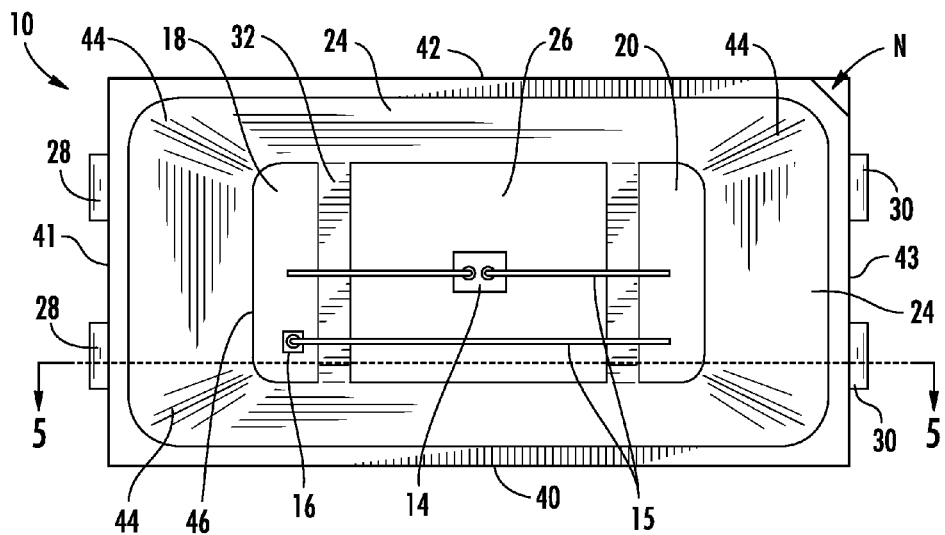
FIG. 2 illustrates a top plan view of an embodiment of an LED package according to the subject matter herein.
Figure 5:
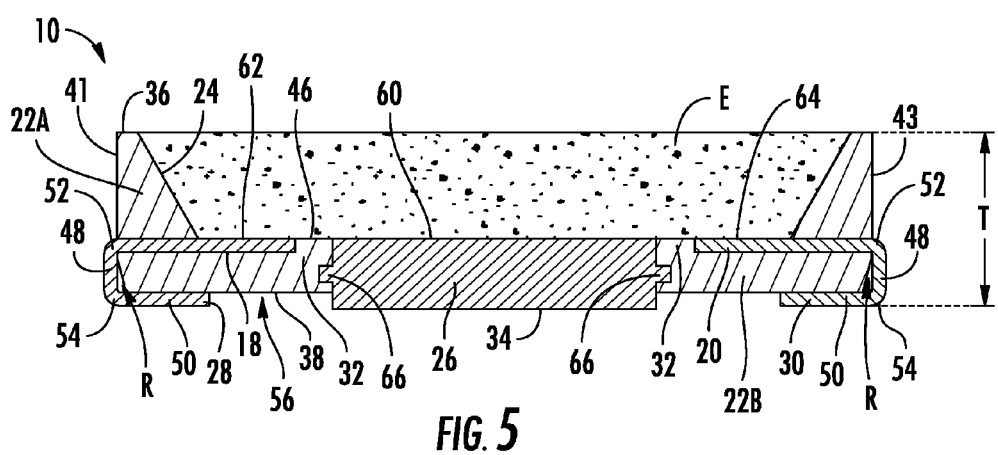
FIG. 5 illustrates a cross-sectional view of an embodiment of a LED package according to the subject matter herein.

FIG. 5 illustrates a cross-sectional view of LED package 10 along 5-5 of FIG. 2 of LED package 10. FIG. 5 illustrates body 12 defining reflector cavity 24. Reflector cavity can comprise a cavity floor 46. In one aspect, cavity floor 46 can be flush with an upper surface 60 of heat transfer material 26. In one aspect, cavity floor 26 can be flush with first and second upper surfaces 62 and 64 of first and second electrical leads 18 and 20, respectively. In one aspect, cavity floor 26 can be flush with each of upper surface 60 and upper surfaces 62 and 64. As previously described, body 12 can comprise any suitable material known in the art, and can be formed about, thereby encasing thermal and electrical elements. Encapsulant E can be disposed to any suitable level within reflector cavity 24 and encapsulant E can optionally containing a phosphor or lumiphor. For illustration purposes encapsulant E is shown as substantially flush with an upper surface 36 of body 12 and the top of the reflector cavity 24, but it can be filled to any level above or below the top of reflector cavity 24 and can comprise a convex or concave surface as may be desired.

Also illustrated in FIG. 5 is heat transfer material 26 which can be disposed at least partially between electrical leads 18 and 20. In other aspects, heat transfer material 26 can be disposed in any suitable configuration with respect to electrical leads 18 and 20. Electrical leads 18 and 20 can be stamped and can have thinner members than heat transfer material 26. In one aspect, heat transfer material 26 can have a thickness extending from cavity floor 46 and through the entire lower portion 22B of LED package 10. Heat transfer material 26 can extend through from the lower surface 38 of LED package 10 and can extend to a plane parallel with bottom surfaces of linear portions 50 of first and second electrical leads 18 and 20, respectively. In one aspect, heat transfer material 26 can have a thickness of 0.5 millimeters (mm). In one aspect, the thickness T of the package can be 0.86 mm. Thus, heat transfer material 26 can be less than approximately 60% of the package thickness thereby maintaining good thermal management properties. In other aspects, heat transfer material 26 can be less than approximately 50% of the package thickness. Heat transfer material 26 can comprise at least one lateral protrusion 66 defined along a lateral wall. Lateral protrusion 66 can be disposed adjacent electrical elements, for example, adjacent first and second electrical leads 18 and 20, respectively. In one aspect, heat transfer material 26 can comprise opposing lateral protrusions 66 defined along opposing lateral walls such that the protrusions extend into body portion 12. Lateral protrusions 66 can promote secure retention of heat transfer material 26 by body 12 and can also reduce the potential for leakage, for example of solder during manufacture of the LED package 10, or of encapsulant E disposed in reflector cavity 24 during operation of LED package 10 along interfaces between the body 12 and the heat transfer material 24. Such protrusions 66 along side walls of heat transfer material 24 may be varied in number, size, shape, and orientation (e.g. angled upward or downward, e.g., FIGS. 12A and 12B). Heat transfer material 26 can be at least partially, electrically and/or thermally isolated from first and second electrical leads 18 and 20, respectively. For illustration purposes, FIG. 5 shows heat transfer material 26 as fully electrically isolated and separated from first and second electrical leads 18 and 20 by one or more isolating portions 32 of body 12.

FIG. 5 further illustrates at least one set of opposing external portions 28 and 30 of first and second electrical leads 18 and 20, respectively, as formed integrally with electrical leads 18 and 20 and extending from opposing lateral sides. External portions 28 can comprise first bends 52 which transition external portions 28 and 30 into vertical portions 48. Vertical portions 48 can bend at second bend 54 and perpendicularly transform thereby forming linear portions 50. Vertical portions 48 can extend downward along lower portion 22B of body 12. Opposing linear portions 50 of first and second metal leads 18 and 20 extend inwardly towards heat transfer material 26 and inwardly towards each other towards a center of LED package 10.

Figure 6A:
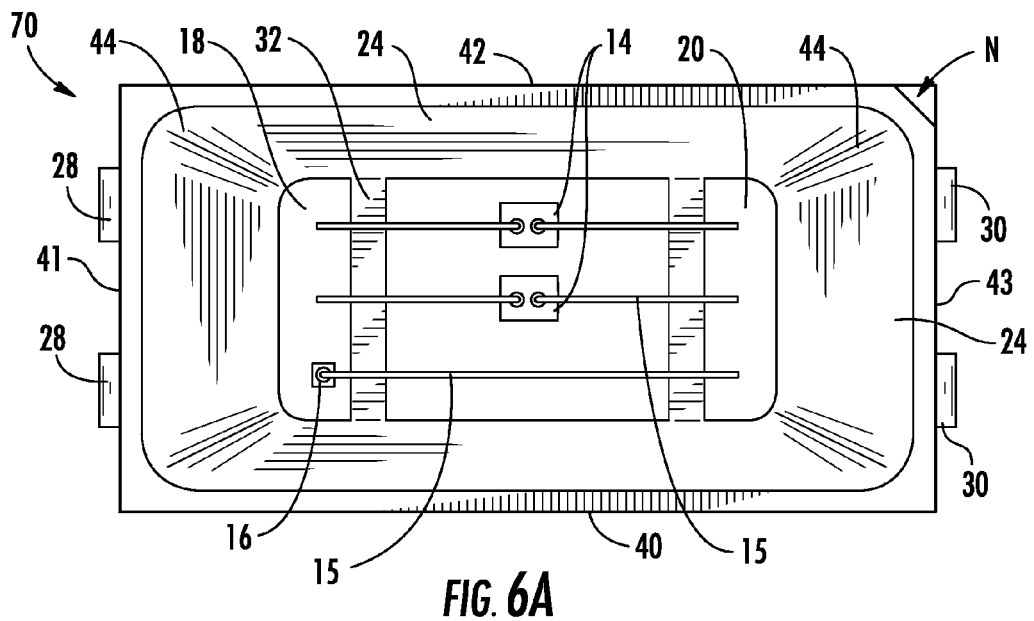
FIGS. 6A and 6B illustrate top plan views of an embodiment of an LED package according to the subject matter herein.
Figure 6B:
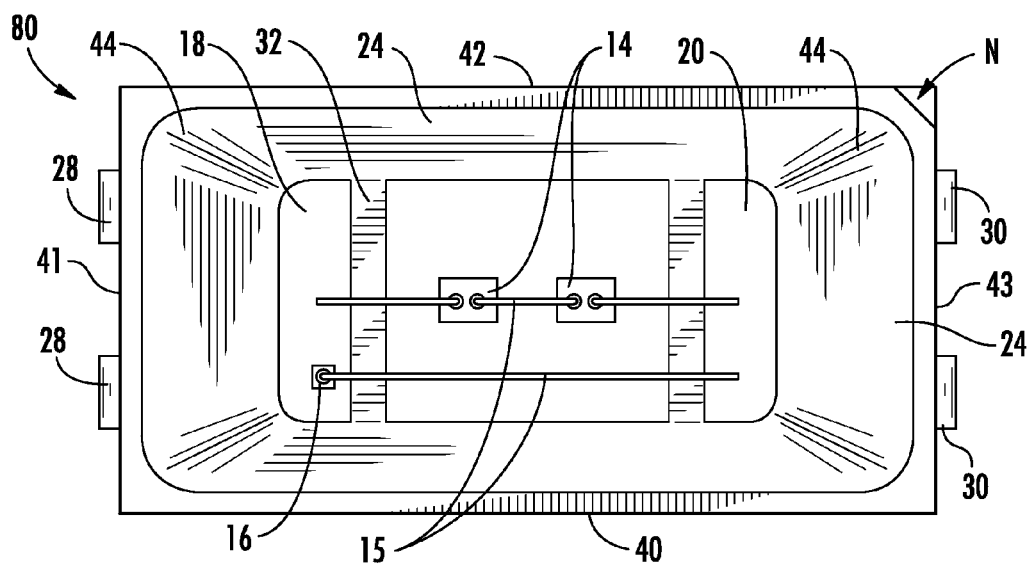

FIGS. 6A and 6B illustrate different embodiments of LED package 10. For example, FIG. 6A illustrates a LED package, generally designated 70 which is similar in form and function to LED package 10. LED package 70, however, comprises at least two LEDs 14 mounted in parallel over heat transfer material 26. That is, LED package 70 can comprise at least two LEDs 14 electrically connected in parallel. Each of the at least two LEDs 14 can electrically connect through one or more wirebonds 15 to each of the first and second electrical leads 18 and 20, respectively. In one aspect, the at least two LEDs 14 can comprise an array of LEDs 14 connected in parallel.

FIG. 6B illustrates an LED package generally designated 80 comprising at least two LEDs 14 electrically connected in series. LED package 80 can be similar in form and function to LED package 10. LED package 80, however, can comprise at least two LEDs mounted in series over heat transfer material 26. That is, LED package 80 can comprise at least, two LEDs 14 wherein a first of the at least two LEDs is electrically connected to first electrical lead 18 and a second of the at least two LEDs 14 is electrically connected to second electrical lead 20. The at least two LEDs 14 are then electrically connected to each other using electrically conductive wirebonds. When connecting LEDs 14 in series, it can be important to electrically connect the electrical terminal of a preceding LED to an opposite electrical terminal of a subsequent LED to ensure electrical current or signal will not be shorted in the series. In one aspect, the at least two LEDs 14 can comprise an array of LEDs connected in series.

Figure 7:
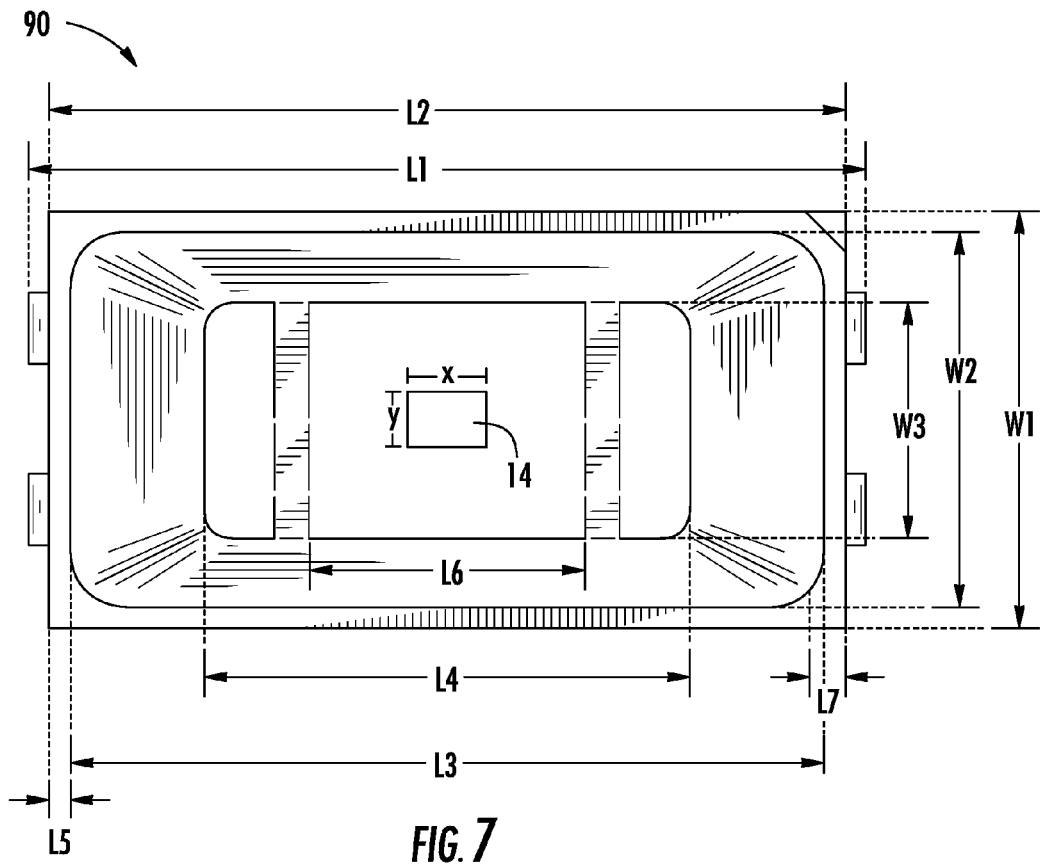
FIG. 7 illustrates a top plan view of an embodiment of an LED package according to the subject matter herein.

FIG. 7 illustrates a top view of an LED package generally designated 90. LED package 90 is shown with one LED 14 schematically illustrated therein but there can be one or more LEDs 14. LED package 90 can be any of packages 10, 70, or 80. LED 14 can have a length designated X and a width designated Y which can be any suitable measurement such as according to the measurement data in Table 2 discussed further below. LED package 90 illustrates various dimensions of the package itself. For example, typical dimensions, for example, lengths, widths, thicknesses, and areas can be such as those illustrated in FIG. 7 and disclosed in Table 1 below.

TABLE 1

| Reference Character | Description of Dimension | Approx. Measurement Ranges (in mm) |
|---|---|---|
| L1 | Overall package length, including portions of electrical leads | 6 to 7 |
| L2 | Length of package body | 5.7 |
| L3 | Length of reflector cavity measured at upper surface of body | 5.4 |
| L4 | Length of cavity floor | 3.47 |
| L5 | Length of upper surface of body disposed outside of reflector cavity | 0.15 |
| L6 | Length of upper surface of heat transfer material | 1.97 |
| L7 | Corner length | 0.3 |
| W1 | Width of overall package body | 2 to 3 |
| W2 | Width of reflector cavity measured at upper surface of body | 2.7 |
| W3 | Width of cavity floor | 1.7 |
| *T | Overall thickness of package | 0.86 |

Figure 9:
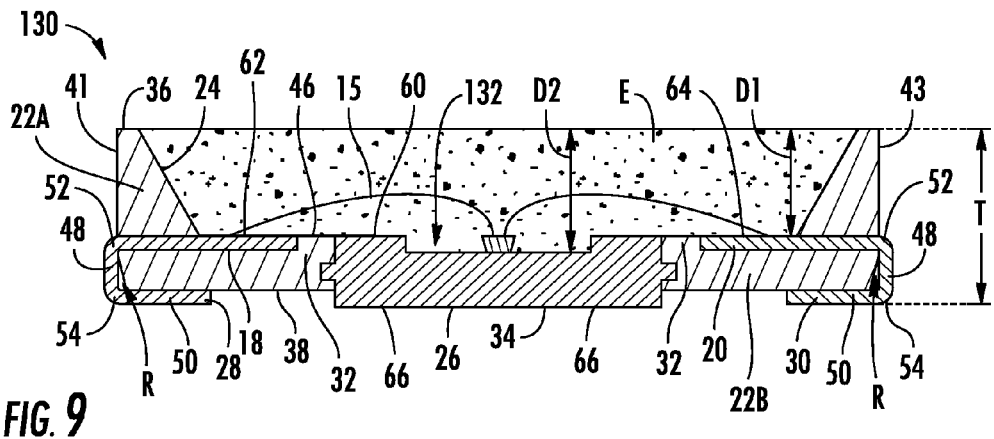
FIG. 9 illustrates a cross-sectional view of an embodiment of an LED package according to the subject matter herein.

*designates the thickness dimension as illustrated in FIGS. 3, 5 and 9

Table 1 illustrates possible length and width dimensions for LED package 10. In one aspect, the overall package area (L1×W1) can be approximately 18 mm when calculated from a 6 mm×3 mm package. In another aspect, overall package width can be 14 mm when calculated from an approximately 7 mm×2 mm package. Any shape, dimension, and structure of LED chip such as LED 14 can be used in LED package 90. As described earlier, more than one LED 14 can be disposed in LED package 90. LED 14 can have various lengths and widths and are not limited to those as shown in Table 1, which are approximately (i) 300 μm×300 μm, (ii) 500 μm×500 μm, (iii) 520 μm×700 μm, and (iv) 430 μm×580 μm. Any suitable dimension of LED 14 can be used. Where thicker LEDs 14 are used, the thickness of overall package T can be approximately 0.97 mm or 1.08 mm or any suitable thickness depending on the thickness of the LEDs disposed in package.

LED package 90 can be provided in various lengths, widths, and in thicknesses with smaller LEDs, such as LED 14, than LEDs in conventional packages. For example and without limitation, Table 2 illustrates various sizes and ratios of dimensions for LED package 90.

TABLE 2

| Package Feature | Approx. Size of Package Feature (L × W (mm)) | Approx. Size of LED (L × W (μm)) | Ratio of LED to Package Feature | % of Package Feature Occupied by LED |
|---|---|---|---|---|
| Package Area (L1 × W1 in FIG. 7) | 6 × 3 | 520 × 700 (=364,000) | 0.020 | 2.02 |
| | 6 × 3 | 500 × 500 (=250,000) | 0.014 | 1.39 |
| | 6 × 3 | 430 × 580 (=249,500) | 0.014 | 1.39 |
| | 6 × 3 | 300 × 300 (=90,000) | 0.005 | 0.50 |
| | 7 × 2 | 520 × 700 | 0.026 | 2.60 |
| | 7 × 2 | 500 × 500 | 0.018 | 1.79 |
| | 7 × 2 | 430 × 580 | 0.018 | 1.78 |
| | 7 × 2 | 300 × 300 | 0.006 | 0.64 |
| Cavity | 3.47 × 1.7 | 520 × 700 | 0.062 | 6.17 |

TABLE 2-continued

| Package Feature | Approx. Size of Package Feature (L × W (mm)) | Approx. Size of LED (L × W (μm)) | Ratio of LED to Package Feature | % of Package Feature Occupied by LED |
|---|---|---|---|---|
| floor Area (L4 × W3 in FIG. 7) | 3.47 × 1.7 | 500 × 500 | 0.042 | 4.24 |
| | 3.47 × 1.7 | 430 × 580 | 0.042 | 4.23 |
| | 3.47 × 1.7 | 300 × 300 | 0.015 | 1.53 |

Table 2 above illustrates for example and without limitation possible LED 14 to package ratios for different size packages. LED 14 can be a range between approximately 0.5 and 2% of the overall package size in an approximately 6×3 mm package where at least one LED is disposed within the package. Ratio and percentage calculations in Table 2 are based on total chip area. That is, in Table 2, the column indicating an approximate size of the LED is the length and width for one LED chip. If two or more LEDs are used in a package, the ratios could change. In one aspect, LED 14 can range less than approximately 5% of the overall package size. In other aspects, LED 14 can range less than approximately 3% of the overall package size. In other aspects, LED 14 can range less than approximately 2% of the overall package size. In other aspects, LED 14 can range less than 1% of the overall package size. In conventional packages similar in size to a 6×3 mm package, the LED such as LED 14 can typically average greater than approximately 2% of the overall package size.

An LED such as LED 14 in accordance with the subject matter herein can range between approximately 0.64% and 2.6% of the overall package size in an approximately 7×2 mm package where at least one LED 14 is disposed within the package. In one aspect, LED 14 can range less than approximately 5% of the overall package size. In other aspects, LED 14 can range less than approximately 3% of the overall package size. In other aspects, LED 14 can range less than approximately 2% of the overall package size. In other aspects, LED 14 can range less than 1% of the overall package size.

Similarly, for a rectangular cavity floor of approximately 3.47×1.7 mm, one LED 14 can range from between 1.53% to 6.17% of the area comprising the cavity floor. That is, in one aspect, LED 14 can be less than approximately 7% of the cavity floor. In a further aspect, LED 14 can be less than or equal to approximately 6.5% of the cavity floor. In other aspects, LED 14 can be less than approximately 5% of the cavity floor. In other aspects, LED 14 can be less than approximately 3% of the cavity floor. In other aspects, LED 14 can be less than approximately 2% of the cavity floor. In other aspects, LED 14 can be less than approximately 1% of the cavity floor. In other aspects, LED 14 can be less than approximately 0.5% of the cavity floor.

Figure 8:
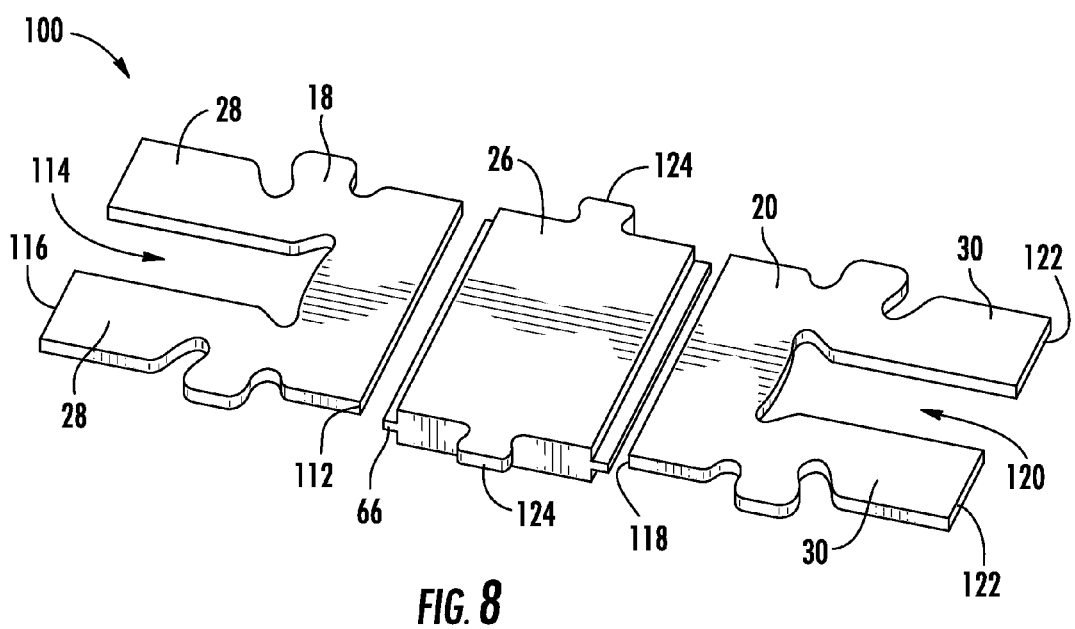
FIG. 8 illustrates a perspective top view of a leadframe disposed within a LED package according to the subject matter herein.

FIG. 8 illustrates one embodiment of a leadframe, generally designated 100 which can be disposed, and in some aspects molded, within an LED package 10. Leadframe 100 can comprise at least one thermal element and one or more electrical elements. Thermal element can comprise heat transfer material 26 and electrical elements can comprise first and second electrical leads 18 and 20, respectively. FIG. 8 illustrates heat transfer material 26 disposed at least partially between first and second electrical leads 18 and 20. Any suitable arrangement is contemplated. First and second electrical leads 18 and 20, can extend outwardly from a proximal edge into one or more external portions 28 and 30. For example, first electrical lead 18 can comprise a proximal edge 112 disposed adjacent to heat transfer material 26. First electrical lead 18 can extend about a first aperture 114 thereby forming at least two external portions 28. First electrical lead can extend about multiple apertures 114 thereby forming a plurality of external portions 28. Each of external portions 28 can bend externally into a vertical portion perpendicular a linear portion as previously described, for example forming a J-bend configuration bending inwardly towards the lower surface of heat transfer material 26. External portions 28 can comprise distal ends 116 distally located from heat transfer material 26 which can be sheared or otherwise separated from a sheet of metal comprising a plurality of leadframes 100.

Similarly, second electrical lead 20 can comprise a proximal edge 118 disposed adjacent to heat transfer material 26. Second electrical lead 20 can extend about a second aperture 120 thereby forming at least two external portions 30. Second electrical lead could extend about multiple apertures 120 thereby forming a plurality of external portions 30. Each of external portions 30 can bend externally into a vertical portion perpendicular a linear portion as previously described, such as forming a J-bend configuration bending inwardly towards the lower surface of heat transfer material 26. Such bending of external portions 28 and/or 30 can be performed after forming of the body structure. External portions 30 can comprise distal ends 122 distally located from heat transfer material 26. Heat transfer material 26 can comprise one or more terminating ends 124 which can be sheared or otherwise singulated from a sheet of leadframes 100. Terminating ends 124 of heat transfer material 124 can be sheared substantially flush with lateral walls, for example, walls 40 and 42 of LED package 10.

Still referring to FIG. 8, each of first and second apertures 114 and 120 can provide multiple benefits. For example, at least a portion of first and second apertures 114 and/or 120 can become at least partially filled with body material. This can promote secure retention of the first and second electrical leads 18 and 20 within the body 12. In addition, each of first and second apertures 114 and 120, respectively, can reduce the amount of lead material (e.g., metal) subject to being bent to form the first and second bends 52 and 54, respectively. This can reduce the amount of bending force required to form the first and second bends 52 and 54 as is particularly desirable when the first and second bends are formed after molding, or otherwise positioning, the body 12 around the electrical leads 18 and 20. Bending is preferably performed sufficiently to position external portions 28 and 30 of first and second electrical leads 18 and 20 at least partially within the recesses 56 of lower surface 38 of the body.

FIG. 9 illustrates another embodiment of a cross-sectional view of an LED package generally designated 130. FIG. 9 can be similar in form and function as that shown in FIG. 5, however, as illustrated thermal element may include a recessed surface disposed in a top surface of the heat transfer material, otherwise known as a down-set surface. FIG. 9 illustrates body 12 defining reflector cavity 24. Reflector cavity can comprise cavity floor 46 that can, in one aspect, can be flush with an upper surface of first and second upper surfaces 62 and 64 of first and second electrical leads 18 and 20, respectively. In one aspect, cavity floor 46 can disposed above upper surface 60 and upper surfaces 62 and 64. That is, the upper surface 60 of heat transfer material 26 can comprise a recess portion 132 that can be down-set from the cavity floor 46. In one aspect, reflector cavity 24 can comprise a depth D1 disposed between cavity floor 46 and upper surface 36 of body 12. In one aspect for example, depth D1 can be 0.36 mm. Depth of reflector cavity 24 can be less than a depth D2 from the upper surface 36 of body 12 and the recess portion 122 of heat transfer material 26. In one aspect, thickness of package from upper surface 36 of body 12 to the bottom of exterior portions of electrical leads 18 or 20 can be approximately equal to or less than 0.86 mm, and the thickness of the heat transfer material 26 which is not recessed can be 0.5 mm. Reflector cavity 24 of LED package 120 can be approximately 42% of the overall thickness T. LED packages 10, 70, and 80 can also have a cavity depth of 0.36 and the same overall package thickness ratio. Conventional LED packages can be thicker and have cavity depths averaging greater than 0.36 mm. Thus, conventional packages disadvantageously have a very different ratio of cavity to overall thickness and have not been optimized to be as thin as possible while maintaining or exceeding brightness levels and thermal management properties.

Figure 10A:
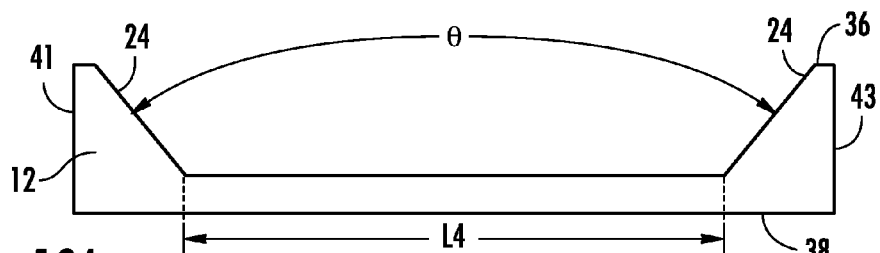
FIGS. 10A and 10B illustrate side views of an embodiment of a LED package according to the subject matter herein.
Figure 10B:
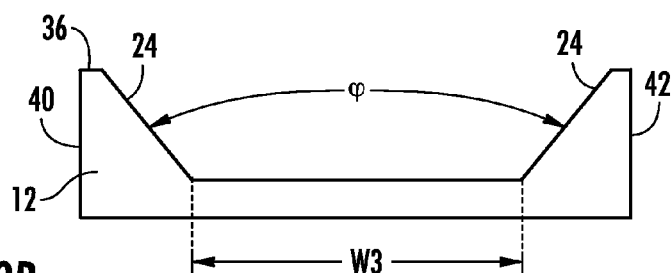

FIGS. 10A and 10B illustrate schematic drawings of cavity angles of which LED packages, such as LED package 10 and other packages described herein can have. In one aspect, a cavity can comprise a cavity angle measured between walls of reflector cavity 24. In one aspect, cavity angles of packages described herein can comprise less than 140°. For example, FIG. 10A illustrates a portion of cavity floor 46 disposed between exterior lateral walls 41 and 43. That is, FIG. 10A illustrates the longer measurement L4 of cavity floor 46. In one aspect for example, the cavity angle θ between the walls of the reflector cavity 24 can be 139.1° where the thickness T of the overall package (FIGS. 3, 9) can be approximately 0.86 mm. In one aspect, cavity angle θ between the walls of the reflector cavity 24 can be at least approximately 135° or more. Where thicker LEDs are used, the overall thickness of the package can increase to approximately 0.97 or 1.08 mm. Thus, in one aspect, the cavity angle θ between the walls of the reflector cavity 24 can be at least approximately 128° or more, such as for example 128.1°, where the thickness T of the overall package is 0.97 mm. In one aspect, the cavity angle θ between the walls of the reflector cavity 24 can be at least approximately 118° or more where the thickness T of the overall package is for example 1.08 mm. The wider cavity angle of packages having thinner, optimized dimensions can allow the reflection level within the package to maintain or exceed the amount of reflected light thereby maintain or exceed current brightness standards.

FIG. 10B illustrates a portion of cavity floor 46 disposed between exterior lateral walls 40 and 42. That is, FIG. 10A illustrates the shorter width measurement W3 of cavity floor 46. In one aspect, the cavity angle φ between the walls of the reflector cavity 24 can be 108.5° where the thickness T of the overall package (FIGS. 3, 9) is approximately 0.86 mm. Where thicker LEDs are used, the overall thickness of the package can increase to approximately 0.97 mm or 1.08 mm. Thus, in one aspect, the cavity angle φ between the walls of the reflector cavity 24 can be 93.5° where the thickness T of the overall package is 0.97 mm. In one aspect, the cavity angle φ between the walls of the reflector cavity 24 can be 81.5° where the thickness T of the overall package is 1.08 mm.

Figure 11:
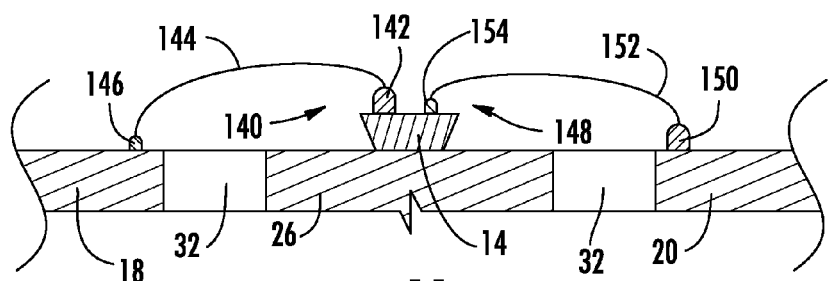
FIG. 11 is a side view of a portion of an LED package showing a mounted LED according to the subject matter herein.

FIG. 11 illustrates a wirebonding method which LED packages, systems, and methods disclosed herein can advantageously incorporate. The wirebonding method can comprise a reverse ball-bonding technique. FIG. 11 illustrates LED 14 mounted over heat transfer material 26. As previously discussed, LED 14 can be directly attached to heat transfer material 26 or indirectly. That is, LED 14 can be attached to an intervening submount or substrate disposed between LED 14 and heat transfer material 26. LED 14 can wirebond to each of electrical leads 18 and 20 for allowing electrical signal to pass between the electrical leads thereby illuminating LED 14. Heat transfer material 26 can be electrically and/or thermally isolated from electrical leads by isolating portions 32 of the body disposed therebetween. A conventional wirebonding method is illustrated on the left hand portion of LED 14, generally designated 140. The conventional wirebonding method can begin by forming a ball 142 over a bondpad of LED 14. A wire 144 extending from the ball connects ball 142 and stitches the wire to the first electrical element 18 forming a stitch 146. As can be noted, the height of stitch 146 is less than the height of ball 142.

Figure 12A:
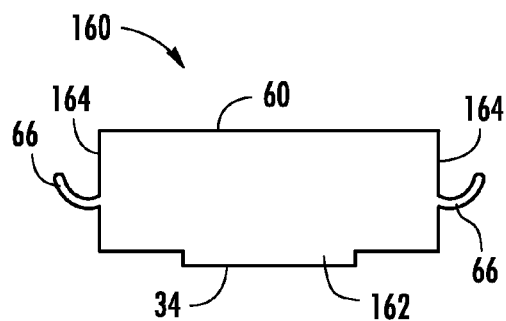
FIGS. 12A and 12B illustrate side views of embodiments of thermal elements of LED package according to the subject matter herein.
Figure 12B:
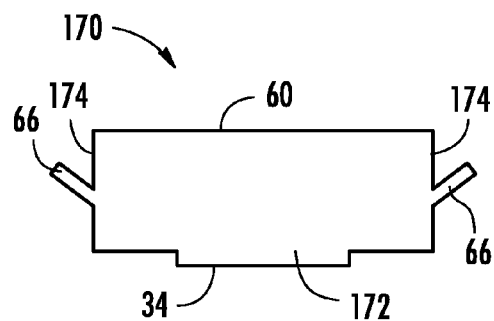

A second wirebonding method is illustrated on the right hand portion of LED 14, generally designated 148. This method is termed reverse wirebonding which can be advantageous to use in thinner LED packages as the loop and ball height over the LED 14 can be reduced. Thus, cavity depth and package thicknesses can be reduced. In reverse wirebonding, a ball 150 can be formed on the electrical element 20 first. A wire 152 can extend from the ball 150 and form a stitch 154 on a bondpad of LED 14. Notably, the loop and ball heights formed on the right hand portion 148 are lower than that of the left hand portion 140. This can be advantageous as smaller cavity depths can be used which can allow for thinner LED packages:

FIGS. 12A and 12B illustrate cross-sectional views of additional embodiments of heat transfer materials for LED packages described herein. As FIGS. 12A and 12B illustrate, lateral protrusions along the exterior edge of heat transfer material can comprise various configurations. For illustration purposes, only two additional embodiments of lateral protrusions are shown, however, any suitable configuration is contemplated. FIG. 12A illustrates a first additional embodiment of heat transfer material, generally designated 160. In this embodiment, heat transfer material 160 can comprise an upper surface 60, a lower surface 34, a lower protruding portion 162, and curved lateral protrusions 66. Curved lateral protrusions 66 can extend outward from lateral side walls 164 of heat transfer material 160. Lower protrusion 162 can be formed integrally with heat transfer material 160 or it can comprise a separate portion affixed thereto using any suitable method. In one aspect, lower protrusion 162 can be advantageous to facilitate better wetting if solder is used to attach LED packages to external substrates. Better wetting can allow for less voids in the solder interface, and can result in a more reliable package.

Referring to FIG. 12B, in another embodiment heat transfer material, generally designated 170 is illustrated. Heat transfer material 170 can comprise an upper surface 60, a lower surface 34, a lower protruding portion 172, and upwardly-angled lateral protrusions 66 extending outward and upward from lateral side walls 174. Downwardly-angled lateral protrusions can be employed in a similar embodiment (not shown). Any suitable configuration of the foregoing lateral protrusions may be employed. Lateral protrusions can be formed by any suitable manufacturing method, including but not limited to stamping, extruding, milling, machining, or any other suitable process. In further embodiments, lateral protrusions can be replaced with, or supplemented by, recesses (not shown) in lateral side walls of heat transfer material for providing similar sealing utility, with such recesses being formable by similar methods.

Figure 13A:
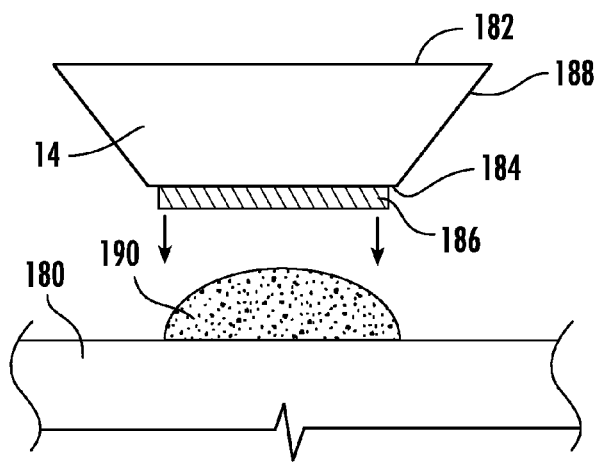
FIGS. 13A and 13B illustrate side views of LED die attach methods according to the subject matter herein.
Figure 13B:
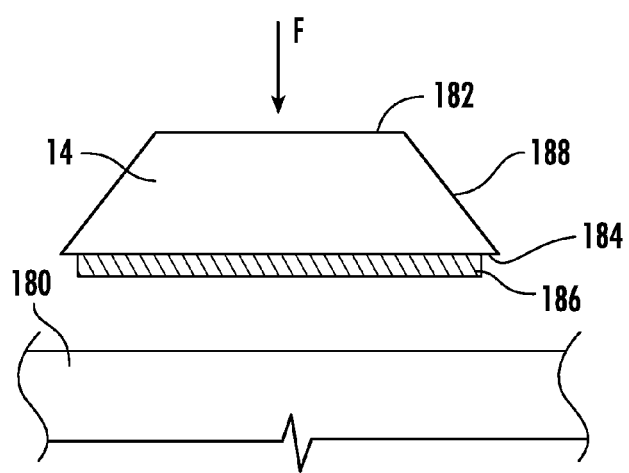

FIGS. 13A and 13B illustrate side views of a LED 14 as it may be positioned for mounting over substrate 180. Substrate 180 can comprise any suitable metallic material and can comprise any substrate within an LED package, such as packages 10 (FIG. 1) or any package described herein. For example, substrate 180 can comprise heat transfer material 26 or any layer otherwise deposited over thermal transfer material 26. LED 14 can comprise any size, shape, dimension, and/or structure of, for example, a LED chip. FIG. 13A illustrates an example of a metal-to-metal die attach. FIG. 13B illustrates another example of a metal-to-metal die attach. Metal-to-metal die attach refers to attaching or bonding of one or more metals of the LED to substrate 180 disposed within an LED package. For example, the metals which can attach during metal-to-metal die attach techniques can comprise at least two of (i) a layer of metal on the backside of LED 14, (ii) metallic substrate 180 within LED package 10 over which the LED will become mounted, and/or (iii) a metal assist material disposed between LED 14 and substrate 180. Substrate 180 can comprise any suitable metal such as, but not limited to, silver (Ag) or platinum (Pt).

FIGS. 13A and 13B illustrate LED 14 comprising an upper surface 180 and a bonding surface 180. LED 14 can comprise a horizontally structured device or a vertically structured device as previously described. Upper surface 182 of LED 14 can comprise one or more bondpads disposed thereon for wirebonding to electrical elements, for example, first and second electrical leads (FIG. 1). In one aspect, LED 14 can comprise a vertically structured device wherein upper surface 182 can comprise a single bondpad. In another aspect, LED 14 can comprise a horizontally structured device wherein upper surface 182 can comprise two bondpads. In a further aspect, LED 14 can comprise a horizontally structured device wherein each of the p and n-sides electrically communicate with substrate 180 such that upper surface 182 does not require bondpads. Bonding surface 184 of LED 14 can comprise a portion of the p-side, n-side, or each of the p and n-sides of an LED device. In one aspect, the LED can be connected to substrate 180 at an insulating side of the LED device. In one aspect, the LED can be connected to a substrate 180 at a portion of the growth substrate or carrier substrate of the LED as previously described.

FIGS. 13A and 13B illustrate bonding surface 184 of LED 14 as comprising a backside metal pad or bonding layer 186 for mounting over substrate 180. Bonding layer 186 can extend the full length and/or surface area of bonding surface 184 or any suitable portion thereof. LED 14 can comprise lateral sides 188 which can extend between upper surface 182 and bonding surface 184. FIGS. 13A and 13B illustrate inclined lateral sides 188, however, lateral sides 188 can be substantially vertical or straight where a straight-cut LED is selected. FIG. 13A illustrates upper surface 182 having a greater surface area than the surface area of bonding surface 184. FIG. 13B illustrates upper surface 182 having a smaller surface area than the surface area of bonding surface 184. In some aspects, bonding surface 184 and upper surface 182 comprise the same surface area. As noted earlier, LEDs 14 can comprise a square, rectangle, or any suitable shaped LED in addition to having any suitable lateral side configuration.

Any suitable die attach method can be used to mount LED 14 within a LED package, for example, over substrate 180. In one aspect, any suitable optimized die attach method and/or materials can be used. For example, optimized die attach methods can comprise metal-to-metal die attach methods for facilitating attachment of one or more metals on and/or between LED 14 and substrate 180. FIG. 13A illustrates an example of a metal-to-metal die attach method which can be eutectic or non-eutectic. This metal-to-metal die attach method can comprise using an attach material 190 to facilitate the metal-to-metal die attach. In one aspect, a flux-assisted eutectic metal-to-metal die attach method can be used and in other aspects a metal-assisted non-eutectic metal-to-metal die attach method can be used. In a flux-assisted eutectic, or flux eutectic, die attach method, bonding layer 186 can comprise a metal alloy having a eutectic temperature, for example, but not limited to, an alloy of gold (Au) and tin (Sn). For example, bonding layer 186 can comprise an 80/20 Au/Sn alloy having a eutectic temperature of approximately 280° C. In the flux eutectic technique, attach material 190 can comprise a flux material. In the non-eutectic technique, attachment material 190 can comprise a metallic material. The flux material can serve as a conduit for facilitating the metal-to-metal die attach between the bonding layer 186 and substrate 180 when the bonding layer 186 is heated above the eutectic temperature. The metal of bonding layer 186 can flow into and attach to the metal of substrate 180. The metal of bonding layer 186 or can atomically diffuse and bond with atoms of the underlying mounting substrate 180. In one aspect, flux used in a flux-assisted eutectic method can comprise a composition, for example, 55-65% rosin and 25-35% polyglycol ether in addition to small amounts of other components. Any suitable flux material can be used however.

One consideration when choosing a material for use in flux-assisted eutectic die attach can be the melting point $T_m$ of the solid state chip bonding layer 186. A flux chosen for use can be liquid at room temperature or can require heating or melting to reach a melting point $T_m$. In one aspect, the body structure of a package in which an LED will be attached can comprise a plastic material having a melting point within approximately 28° C. or less of the eutectic temperature of the bonding layer. In one aspect, at least one LED can be mounted over the substrate 180 at a mounting temperature of approximately 280° C. or greater. Body 12 can comprise a plastic material with a melting point of approximately 28° C. or less from the mounting temperature at which the at least one LED is mounted or attached. The melting point can be approximately 25° C. or less from the mounting temperature at which the at least one LED is mounted or attached, approximately 20° C. or less from the mounting temperature at which the at least one LED is mounted or attached, or even approximately 10° C. or less from the mounting temperature at which the at least one LED is mounted or attached. Using flux-assisted eutectic die attach in such a package is unexpected based upon this small temperature difference and the possibility that the plastic may begin to be adversely affected during the die attach process.

Flux-assisted eutectic die attach methods can be tedious, and it is unexpected to use such methods when attaching LEDs within a molded plastic package body or for backlighting applications or situations. The flux eutectic die attach according to the present subject matter can utilize dispensing flux assist material 190, that can be liquid at room temperature, in an amount to be precisely the right volume to avoid either swimming of the LED chips or poor die attach if too much or too little flux is used. Flux-assisted eutectic die attach according to the present subject matter can also require the right composition for each of the flux assist material 190 and bonding metal 186 of the LED chips. Flux-assisted eutectic die attach according to the present subject matter can optimally utilize a very clean and flat surface and substrates that do not move or bend during heating and cooling such to stress the solder joint. Flux-assisted eutectic according to the present subject matter can utilize a fine surface roughness that is small enough not to encumber the Au/Sn bonding surface of the LED chips while being rough enough to allow flux to escape during heating. The heating profile can be matched perfectly to the bonding metal 186, such as Au or AuSn, to ensure a good weld between the bonding metal 186 and underlying substrate 180. Using flux-assisted eutectic for die attach according to the present subject matter also can utilize an inert atmosphere, such as a nitrogen atmosphere, to reduce oxygen gas ($O_2$) levels and also allow gravity to apply a downward force on the LED 15. This can reduce the amount of oxidation at the metal-to-metal bond between bonding layer 186 and underlying substrate 180.

Flux-assisted eutectic die attach can comprise several process techniques, for example, using a heated collet for dispensing the flux material 190, heating the substrate and/or entire LED package, forming a gas, and applying pressure to the LED to the underlying mounting substrate. Methods can also comprise using a heated collet in combination with heating the mounting substrate and/or entire LED package and applying pressure. Body 12 can be heated quickly using microwave, laser, conduction and/or excitation fields, etc. all which can be done quickly and in an inert atmosphere allowing the body 12 to attain at least the eutectic temperature of the Au/Sn bonding metal on the LED (at least approximately 280° C.). Heating thereby facilitates adequate metal-to-metal bonding between the bonding layer 186 of LED chips and underlying mounting substrate 180. In one aspect, sonic scrubbing or thermo-sonic scrubbing techniques can also be used, as the friction of the scrubbing step can generate the heat required for metal-to-metal bonding. Flux-assisted eutectic die attach methods can also comprise plasma cleaning in an inert atmosphere before and/or after flux eutectic die attach.

Still referring to FIG. 13A, a non-eutectic metal-to-metal die attach method can be used which can also comprise an assist material 190, the assist material 190 can comprise a metallic material. In this aspect, bonding layer 186 can comprise a single metal or a metal alloy. For example, bonding layer 186 can comprise Au, Sn, or AuSn. In non-eutectic methods, the bonding layer does not need to reach or exceed a temperature, for example, a eutectic temperature. In this aspect, assist material 190 can comprise a metallic material to facilitate the metal-to-metal bonding. For example, assist material 190 can comprise AuSn paste or Ag epoxy. Any suitable metallic assist material 190 can be used. The metal of bonding layer 186 can attach to the metal of the assist material 190. The metal of the assist material 190 can also attach to the metal of substrate 180. In one aspect, a metal "sandwich" forms between bonding layer 186, assist material 190, and substrate 180 in non-eutectic metal-to-metal attach techniques where a metallic assist material 190 is used. Metal-assisted, non-eutectic die attach can be tedious, just as flux-assisted methods, and it is also unexpected to use such methods when attaching LEDs within a molded plastic package body or for backlighting applications or situations. Metal-to-metal attachment using an assist material 190 can be hard to control and tedious when attaching multiple LEDs within a package having a plastic body. Heating the package to the appropriate temperature such that assist material 190 can facilitate metal-to-metal die attach can be hard to achieve in plastic packages, for example, packages comprising optimized plastic.

FIG. 13B illustrates a metal-to-metal die attach technique which does not require an assist material 190. One such method can comprise a thermal compression die attach method wherein the metal of bonding layer 186 will directly attach to the metal of substrate 180. The thermal compression method can be eutectic or non-eutectic. In one aspect, thermal compression can be used when bonding layer 186 comprises an alloy having a eutectic temperature. In other aspects, bonding layer 186 can comprise a metal not having a eutectic temperature. Substrate 180 can comprise any suitable metal, not limited to Ag or Pt. In one aspect, bonding layer 186 comprises any suitable metal. In one aspect, bonding layer 186 can comprise a layer of Sn having any suitable thickness. In one aspect, bonding layer 186 can comprise a thickness greater than approximately 0 μm. In one aspect, bonding layer 186 can comprise a bonding layer equal to or greater than at least approximately 0.5 μm. In one aspect, bonding layer 186 can comprise a layer of Sn having a thickness of at least equal to or greater than approximately 2.0 μm. Unlike the flux-assisted eutectic or metal-assisted non-eutectic methods just described, thermal compression metal-to-metal die attach techniques can utilize an external downward force F as illustrated in FIG. 13B. Force F can comprise a compression delivered in a heated environment, thus deemed a thermal compression, as opposed to dispensing a flux or metallic assist material 190. The thermal compression technique is an alternative die attach method developed to reduce metal squeeze out of the bonding layer 190 which can form Shottky or Shunt defects and allow subsequent leakage of current and other various and related problems. In one aspect, the bonding temperature in thermal compression techniques can be approximately 255-265° C. after subjecting substrate 180 to a pre-heat treatment or process. The substrate can be heated to a mounting temperature of at least 20° C. above the melting temperature of the bonding layer 186. The bonding time can be approximately 300 msec and the bonding force can be approximately 50+/−10 grams (g). Predetermined settings can be important for this method, including adequate preheat, bonding temperature, bonding time, and bonding force. The equipment and predetermined settings for use with thermal compression methods can be difficult to use and/or maintain, and it is unexpected to use such methods when attaching LEDs within a molded plastic package body or for backlighting applications or situations.

Although metal-to-metal methods have previously been used in solid state device packages comprising ceramic substrates and package bodies (in non-backlighting situations), it is not known and is unexpected to use flux-assisted eutectic, metal-assisted non-eutectic, or thermal compression die attach techniques for device packages having molded plastic bodies. It is also not known and is unexpected to use flux-assisted eutectic, metal-assisted non-eutectic, and/or thermal compression attach techniques in LED backlighting situations as described further herein. It is also quite unexpected to use flux-assisted, metal-assisted, or thermal compression die attach techniques with molded plastic body 12 having optimized plastic material that can have, for example, a $T_m$ of approximately 307° C. Light packages having LEDs utilizing metal-to-metal die attach methods as described herein can, for example and without limitation, offer light output of up to 122 lumens at 300 mA in cool white (CW), and up to 100 lumens at 300 mA in warm white (WW) color points. For example, LED packages disclosed herein can be used in lighting fixtures offering a minimum CRI for CW color points of 65 CRI. LED packages disclosed herein can be used in lighting fixtures offering a minimum CRI for CW color points of 75 CRI which corresponds to a range of 5,000 K to 8,300 K CCT. LED packages disclosed herein can also offer, for example, a minimum CRI for WW color points of 80 CRI which corresponds to a range of 2,600K to 3,700K CCT. Such LED packages described herein can be used for backlighting applications targeting backlighting color points and for both standard and high voltage configurations.

Packages disclosed herein can have longer L70 lifetime values than conventional packages by combining features such as, but not limited to, using optimized plastic and/or metal-to-metal die attach methods and materials in accordance herewith. The metal-to-metal die attach method can for example comprise one of the flux-assisted eutectic, metal-assisted non-eutectic, or thermal compression methods described in FIGS. 13A and 13B. It is believed that LED packages in accordance with the subject matter herein will be the first LED packages for backlighting to be ENERGY STAR® compliant and therefore meet the standards for energy efficiency set by the US Environmental Protection Agency (EPA). ENERGY STAR® products are those meeting the energy efficiency requirements set forth in ENERGY STAR® product specifications, the entire contents of which are hereby incorporated by reference herein.

FIG. 14 illustrates an expanded perspective view of a representative flat display panel system, generally designated 200 in which LED packages described herein can be utilized. Embodiments described and illustrated herein can provide uniform backlighting for small or large area display panels greater or less than a dimension of 17" diagonal. Display panel system 200 can be combined with other electrical and/or mechanical elements to provide computer monitors, televisions, and/or other flat display panels. As used herein, "uniform" backlighting means than an ordinary viewer who views the display at a conventional viewing distance is not aware of any discrepancy or variation in backlighting intensity. In some embodiments, variations of less than about 25% can provide uniform intensity, whereas, in other embodiments variations of less than 5% can provide uniform intensity. Display panel system 200 can comprise square, rectangle, or any suitable shaped panels of any suitable dimension. Embodiments of display panels described herein can provide direct backlighting of flat panel LCDs.

FIG. 14 illustrates display panel system 200 comprising an illumination panel 202 and a display panel, or LCD panel 204. Illumination panel 202 can comprise a plurality of LED packages or LEDs 206. In one aspect, illumination panel 202 can comprise a planar (i.e., two dimensional) array of LEDs 206 mounted either directly over illumination panel 202 or arranged in packages over illumination panel 202. LEDs 206 can be spaced apart from one another at a predetermined distance, or pitch P so as to provide substantially uniform backlighting of LCD panel 204. LEDs 206 can be packed in a random array, a grid array (as shown), a staggered array, or any suitable array. Uniform and/or non-uniform packing may be provided. Pitch P between adjacent LEDs 206 can allow for uniform backlighting of at least a portion of LCD panel 204. In one aspect, LEDs 206 can provide uniform backlighting over the entire LCD panel 204. A frame (not shown) can be disposed about illumination panel 202 and LCD panel 204 to hold the panels adjacent and either together or spaced apart with one or more gaps disposed therebetween.

LCD panel 204 can comprise a flat display panel having planar array of LCD devices, or cells. In one aspect, LCD panel 204 can comprise a planar array of liquid crystal devices arranged into a matrix of pixels (not shown). An image can form on a front display surface 208 of LCD panel 204 when the liquid crystal devices are subjected to backlight illumination. To provide backlight illumination to LCD panel 204, the planar array of LEDs 206 comprising illumination panel 202 can be arranged into a matrix such that each LED 206 is arranged to provide illumination to a single LCD device or to a plurality of LCD devices thereby collectively defining specific images on display surface 208. Backlight LEDs 206 can be arranged to illuminate the entirety or a portion of LCD panel 204, the illumination passing through LCD panel 204 from a back surface 210 of the panel through the LCD pixels to the front surface 208 of the display panel. LCD panel 204 can comprise the back surface 210 parallel and opposing front surface 208 and a thickness disposed therebetween defined by the LCD devices, or cells. The thickness of LCD panel 204 can be any suitable dimension.

Optionally, one or more optical layers 212 may be disposed between illumination panel 202 and LCD panel 204. Optical layer 212 can comprise at least one layer or film such as polarizing films, light scattering films, light guide films or any suitable film capable of manipulating light emitted by illumination panel 202. In one aspect, optical layer 212 can comprise a diffuser that distributes light uniformly behind the viewing area. In one aspect, optical efficiency may be enhanced by direct backlighting such that the need for diffusing and/or optical films between illumination panel 202 and LCD panel 204 may be reduced or eliminated. In one aspect, optical layer can comprise an edge 511 along which one or more LEDs 206 may direct light. Optionally, the light could be directed along an edge of LCD panel as described in FIG. 15B.

Figure 15A:
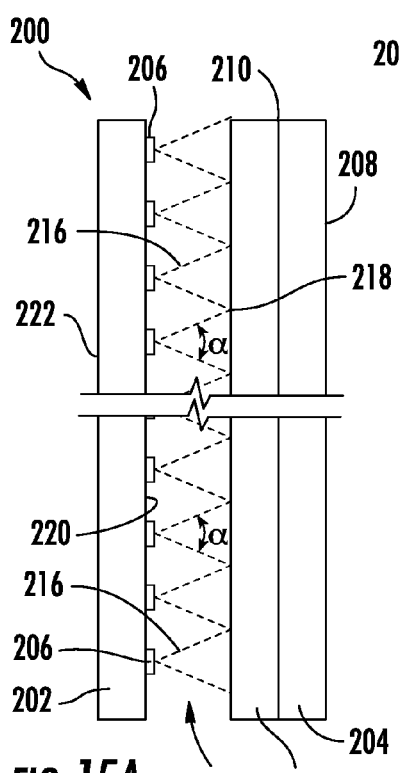
FIGS. 15A and 15B illustrate side views of a LED backlighting system according to the subject matter herein.
Figure 15B:
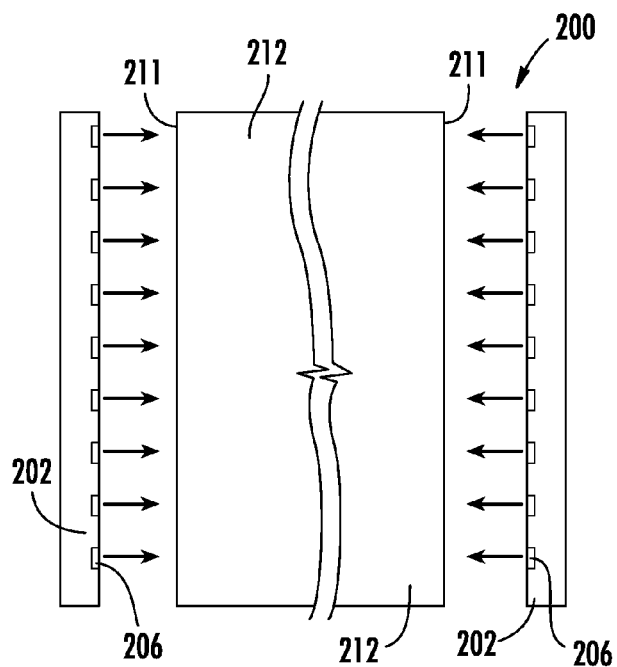
Figure 16:
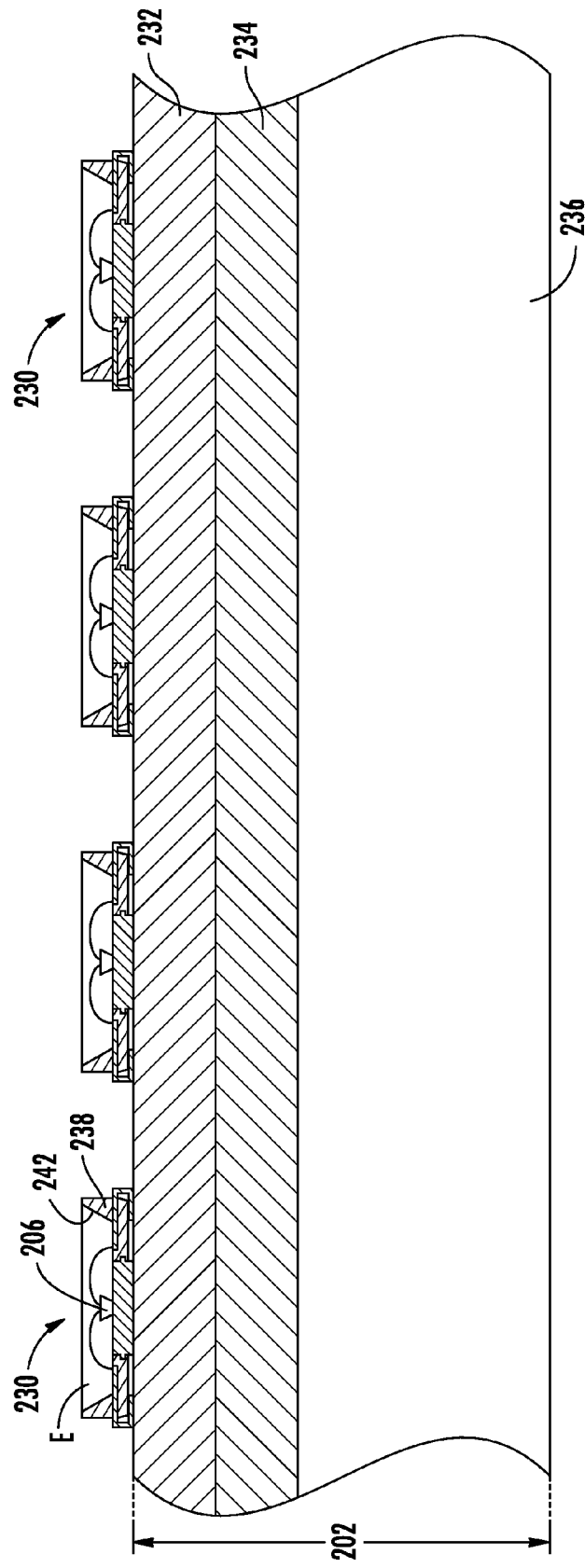
FIG. 16 illustrates a side view of an illumination panel used in a LED backlighting system according to the subject matter herein.

FIGS. 15A and 15B illustrate different cross-sectional views of an unexpanded display panel 200 described and illustrated by FIG. 14. For illustration purposes, the figures illustrate LEDs 206 directing light toward optical layer 212, however, the LEDs 206 in each of FIGS. 15A and 15B could direct light toward LCD panel 204 instead. That is, in FIG. 15A optical layer 212 could be excluded, and in FIG. 15B, optical layer 212 could be replaced with LCD panel 204. The figures could otherwise be the same.

FIG. 15A illustrates one or more LEDs 206 mounted over illumination panel 202 providing direct backlighting to LCD panel 204. LEDs 206 can be disposed adjacent each other spaced apart a pitch P in rows, columns, and/or a random array (FIG. 14). Pitch P can be the same dimension for LEDs 206 spaced apart between the rows and columns of the planar array, or the LEDs can be spaced apart in rows at a first pitch and spaced apart in columns at a second pitch. Alternatively, any suitable pitch P and variations of pitch can be used between the planar array of LEDs 206. FIG. 15A illustrates at least one optical film or layer 212 disposed between illumination panel 202 and LCD panel 204, however, such film is optional. LEDs 206 can provide backlighting directly to LCD panel 204. In one aspect, the planar array of LEDs 206 can be configured to transmit light directly to the planar array of LCD pixels comprising LCD panel 204 over a space, or gap, generally designated 214. Gap 214 can be disposed between illumination panel 202 and LCD panel 204, or optical layer 212, and can define a space across which one or more individual light paths 216 can extend from the one or more LED devices 206. In one aspect, light paths 216 can extend perpendicular to the planar array of LEDs 206 and perpendicular to LCD panel 204. In other aspects, lights paths 216 can extend from an edge parallel LCD panel 204 or be reflected perpendicular LCD panel 204. That is, in some aspects, at least some of the LEDs 206 can be disposed within a periphery of the LCD panel 204.

Still referring to FIG. 15A and in one aspect, each LED device 206 comprising the planar array of LEDs can emit light at an illumination angle α that can conform to desired radiation patterns. The edges of adjacent light paths 216 can just meet at a periphery 218, or slightly overlap depending on pitch P at which adjacent LEDs 206 are spaced. When one or more LEDs 206 are spaced at pitch P shown, adjacent light paths 216 can intersect, or touch, at periphery edges 218. If spaced closer together, individual light paths 216 can overlap. Different grids or arrangements of planar arrays of LEDs 206 can also affect the overlap and distribution of light paths 216. In one aspect, light paths 216 can intersect at periphery edges 218 and/or overlap to provide uniform backlighting illumination to LCD panel 204. FIG. 15A illustrates at least one column of the planar array of LEDs 206. Light paths 216 from respective LEDs 206 in adjacent columns and/or rows can intersect and/or overlap. LEDs 206 can also be configured for indirect backlighting of LCD panel 204, for example, LEDs 206 can be disposed around edges of illumination panel and indirectly reflect and illuminate LCD panel 204.

FIG. 15A further illustrates illumination panel 202 comprising a first surface 220 over which the one or more LEDs 206 can mount. Illumination panel 202 can comprise a second surface 222 parallel and opposing first surface 220. First surface 220 of illumination panel 202 can face optical layer 212. In one aspect, first surface 220 of illumination panel 202 can face back surface 210 of LCD panel 204. Illumination panel 202 can comprise any suitable substrate over or onto which LEDs 206 may be mounted. For example, LCD panel 202 can comprise a circuit, PCB, MCPCB, or any other suitable substrate. First surface 220 of illumination panel 202 can comprise an electrically and/or thermally conductive surface. In one aspect, first surface 220 can comprise a metallic surface over which the one or more LEDs 206 can mount. In another aspect, top surface 520 can comprise a planar array of metallic surfaces over which the planar array of LEDs 206 can mount. One or more conductive traces (not shown) can connect the planar array of metallic surfaces such that electrical current or signal can flow to each of LEDs 206.

FIG. 15B illustrates another embodiment of panel display system 200. In this system, the arrows indicate light being directed from the one or more LEDs 206 toward opposing side edges 211 of optical layer 212. Optionally, the light can be directed toward an edge of LCD panel 204. This embodiment comprises an edge lighting panel display system where the one or more LEDs direct light towards edges, rather than directly behind, the panels of panel display system 200. LEDs 206 can be arranged in any suitable manner, such as in an array, and can be in any suitable LED package or outside of a package. LEDs 206 can be connected to a structure that can be positioned directly against and in contact with side edges 211 or can be spaced apart from side edges 211. As shown in FIG. 15B, LEDs 206 are shown spaced apart for illustration purposes only.

FIG. 16 illustrates one embodiment of an illumination panel used in a LED backlighting system according to the subject matter herein. As previously discussed, LEDs attached within LED packages described herein can comprise a robust metal-to-metal die attach such as, but not limited to, flux eutectic, non-eutectic, and thermal compression die attach. FIG. 16 illustrates one or more LED packages 230 attached over illumination panel 202. LED package 230 can comprise any LED package described herein. For example, LED package 230 can be similar in form and function to LED package 10 previously described. Illumination panel 202 can comprise a fully integrated, solid electrically and thermally conductive panel, or in the alternative it can comprise one or more layers. In one aspect, illumination panel 202 can comprise a MCPCB having an electrically conductive layer 232 to which LEDs packages 230 can mount. One or more electrically insulating but thermally conductive layers 234 can be disposed adjacent and under electrically conductive layer 232. In one aspect, thermally conductive layer 234 comprises a dielectric layer. A core layer 236 can be disposed adjacent and under thermally conductive layer 234. In one aspect, core layer 236 can comprise a metal core substantially formed wholly of aluminum or copper.

As FIG. 16 illustrates one or more LEDs 206 can be arranged in LED packages 230 over illumination panel 202. At least one LED can be arranged within the package, however, more than one LEDs can also be mounted therein. In one aspect, emitter packages 230 can comprise a body structure 238 formed using optimized plastic materials previously described. In another aspect, emitter packages 230 can comprise a body 238 formed using any suitable plastic, non-plastic, silicone, or ceramic material. Packages can comprise a reflector cavity 242 as illustrated in FIG. 16 having encapsulant E disposed therein, the encapsulant filled to any suitable level within package 230. LEDs 206 can be attached within packages 230 using assisted eutectic or non-eutectic die attach methods, or thermal compression methods described herein. Assisted methods can comprise flux-assisted eutectic die attach and metal-assisted non-eutectic die attach methods. Encapsulant E can be dispensed or otherwise placed in a package 230 to an amount even with the body structure, or to an amount such that a concave or convex surface forms. Encapsulant E can comprise one or more phosphors for emitting light of a desired wavelength.

LEDs 206 for use in backlighting or other panel display systems can comprise an arrangement or planar arrays of red, green, and blue LED devices configured to emit light that appears as a pixel of white light in operation. Sizes of red, green, and blue LEDs can be selected to meet a desired brightness and/or intensity balancing level. Any configuration of the red, green, and blue LEDs can be used. LED packages and/or LEDs utilizing metal-to-metal die attach methods as described herein can be used in backlighting systems and any suitable display panel system 200. For example and without limitation, LED packages and/or LEDs used in backlighting and display panel systems can offer light output of up to 122 lumens at 300 mA in cool white (CW), and up to 100 lumens at 300 mA in warm white (WW) color points. For example, LED packages and/or LEDs disclosed herein can be used in lighting fixtures comprising fixtures used in display panel systems offering a minimum CRI for CW color points of 65 CRI. LED packages and/or LEDs disclosed herein can be used in lighting fixtures comprising fixtures used in display panel systems offering a minimum CRI for CW color points of 75 CRI which corresponds to a range of 5,000 K to 8,300 K OCT. LED packages and/or LEDs disclosed herein for use in display panel systems can also offer, for example, a minimum CRI for WW color points of 80 CRI which corresponds to a range of 2,600K to 3,700K CCT. Such LED packages and/or LEDs can be used for both standard and high voltage configurations.

Embodiments of the present disclosure shown in the drawings and described above are exemplary of numerous embodiments that can be made within the scope of the appended claims. It is contemplated that the configurations of thinner LED packages having higher brightness and reduced footprints and methods of making the same can comprise numerous configurations other than those specifically disclosed herein.

What is claimed is:

1. A light emitting device package, the package comprising:
   a package body comprising a package area; and
   at least one light emitting diode (LED) disposed within the package body, wherein the at least one LED comprises a length of less than approximately 550 micrometers (μm);
   wherein the at least one LED occupies an area approximately equal to 2 percent (%) or less of the package area.

2. The package of claim 1, wherein the package body comprises a package thickness of approximately 0.86 millimeters (mm).

3. The package of claim 1, wherein the package body comprises a cavity provided therein, and wherein the cavity comprises a cavity depth of approximately 0.36 millimeters (mm).

4. The package of claim 1, wherein the package comprises an electrically isolated heat transfer material.

5. The package of claim 4, wherein the heat transfer material comprises a thickness of approximately 0.5 millimeters (mm).

6. The package of claim 1, wherein the package comprises a cavity provided between one or more walls of the package body, and wherein the cavity comprises a cavity floor, and the at least one LED occupies an area less than or equal to approximately 6.5% of an area of the cavity floor.

7. The package of claim 1, wherein the package body comprises a package length of approximately 6 millimeters (mm) and a package width of approximately 3 millimeters (mm).

8. The package of claim 1, wherein the package body comprises a package length of approximately 7 millimeters (mm) and a package width of approximately 2 millimeters (mm).

9. The package of claim 1, wherein the at least one LED comprises a width of less than approximately 700 micrometers (μm).

10. The package of claim 1, wherein the at least one LED comprises a length of approximately 520 micrometers (μm) and a width of approximately 700 micrometers (μm).

11. The package of claim 1, wherein the at least one LED comprises a length of approximately 500 micrometers (μm) and a width of approximately 500 micrometers (μm).

12. The package of claim 1, wherein the at least one LED comprises a length of approximately 430 micrometers (μm) and a width of approximately 580 micrometers (μm).

13. The package of claim 1, wherein the package body comprises an upper surface disposed outside of a reflector cavity, the upper surface comprising a length of approximately 0.15 millimeters (mm).

14. The package of claim 1, wherein the at least one LED is mounted in the package body using flux-eutectic, non-eutectic, or thermal compression die attach.

15. The package of claim 1, wherein the package body comprises plastic.

16. The package of claim 1, wherein the package comprises two LEDs.

17. The package of claim 16, wherein the two LEDs are electrically connected in series.

18. The package of claim 16, wherein the two LEDs are electrically connected in parallel.

19. The package of claim 1, wherein the package body comprises a cavity, and wherein the cavity comprises a cavity angle of approximately 135° or more.

20. The package of claim 1, wherein the package body comprises a cavity, and wherein the cavity comprises a cavity angle of approximately 128° or more.

21. The package of claim 1, wherein the package body comprises a cavity, and wherein the cavity comprises a cavity angle of approximately 118° or more.

22. The package of claim 1, wherein the package is ENERGY STAR® compliant.

23. A light emitting device package, the package comprising:
    a package body comprising a cavity disposed between an upper surface of the package body and a cavity floor, the cavity floor comprising an area; and
    at least one light emitting diode (LED) disposed within the package body;
    wherein the at least one LED occupies an area less than or equal to approximately 6.5 percent (%) of the area of the cavity floor; and
    wherein the cavity comprises a cavity angle of approximately 118° or more.

24. The package of claim 23, wherein the package body comprises a package thickness of approximately 0.86 millimeters (mm).

25. The package of claim 23, wherein the cavity depth of approximately 0.36 millimeters (mm).

26. The package of claim 23, wherein the package comprises an electrically isolated heat transfer material.

27. The package of claim 23, wherein the heat transfer material comprises a thickness of approximately 0.5 millimeters (mm).

28. The package of claim 23, wherein the package body comprises a package length of approximately 6 mm and a package width of approximately 3 millimeters (mm).

29. The package of claim 23, wherein the package body comprises a package length of approximately 7 millimeters (mm) and a package width of approximately 2 millimeters (mm).

30. The package of claim 23, wherein the at least one LED comprises a length of less than approximately 550 micrometers (μm).

31. The package of claim 23, wherein the at least one LED comprises a width of less than approximately 700 micrometers (μm).

32. The package of claim 23, wherein the at least one LED comprises a length of approximately 520 micrometers (μm) and a width of approximately 700 micrometers (μm).

33. The package of claim 23, wherein the at least one LED comprises a length of approximately 500 micrometers (μm) and a width of approximately 500 micrometers (μm).

34. The package of claim 23, wherein the at least one LED comprises a length of approximately 430 micrometers (μm) and a width of approximately 580 micrometers (μm).

35. The package of claim 23, wherein the package body comprises an upper surface disposed outside of a reflector cavity, the upper surface comprising a length of approximately 0.15 millimeters (mm).

36. The package of claim 23, wherein the at least one LED is mounted in the package body using flux-eutectic, non-eutectic, or thermal compression die attach.

37. The package of claim 23, wherein the package body comprises plastic.

38. The package of claim 23, wherein the package comprises two LEDs.

39. The package of claim 38, wherein the two LEDs are electrically connected in series.

40. The package of claim 38, wherein the two LEDs are electrically connected in parallel.

41. The package of claim 23, wherein the cavity comprises a cavity angle of approximately 135° or more.

42. The package of claim 23, wherein the cavity comprises a cavity angle of approximately 128° or more.

43. The package of claim 23, wherein the package is ENERGY STAR® compliant.

44. A light emitting device package, the package comprising:
    a package body comprising a cavity;
    a heat transfer material electrically isolated from at least one electrical element;
    at least one light emitting diode (LED) disposed over the heat transfer material; and
    wherein the cavity comprises a cavity depth of less than approximately 0.36 millimeters (mm) and a cavity angle of approximately 135° or more.

45. The light emitting device package of claim 44, wherein the package comprises a package thickness of less than approximately 0.9 millimeters (mm).

46. The light emitting device package of claim 44, wherein the package is disposed in a panel display system.

47. The light emitting device package of claim 44, wherein the package is disposed in backlighting panel display systems.

48. The light emitting device package of claim 44, wherein the package body comprises plastic.

49. The light emitting device package of claim 44, wherein the package length comprises at least approximately 6 millimeters (mm) and the package width comprises at least approximately 3 millimeters (mm).

50. The light emitting device package of claim 44, wherein the package length comprises at least approximately 7 millimeters (mm) and the package width comprises at least approximately 2 millimeters (mm).

51. A light emitting device package, the package comprising:
a package body comprising a package length and a package width, where the package length is different from the package width;
at least one light emitting diode (LED) disposed in the package body; and
wherein the package body comprises a package thickness of less than approximately 0.89 millimeters (mm).

52. The light emitting device package of claim 51, wherein the package thickness comprises approximately 0.86 millimeters (mm).

53. The light emitting device package of claim 51, wherein the package is ENERGY STAR® compliant.

54. A display panel system comprising:
a panel;
at least one light emitting diode (LED) package for providing light to the panel, the at least one LED package comprising:
a body comprising a package length and a package width, where the package length is different from the package width;
at least one light emitting diode (LED) disposed in the body; and
wherein the package body comprises a package thickness of less than approximately 0.89 millimeters (mm).

55. The display system of claim 54, wherein the LED package directly backlights the panel.

56. The display panel system of claim 54, wherein the LED package is configured to illuminate the side edge of the panel.

57. The display panel system of claim 54, wherein the system is ENERGY STAR® compliant.

58. A display panel system comprising:
a panel; and
at least one light emitting diode (LED) package for providing light to the panel, the at least one LED package comprising:
a package body comprising a package area; and
at least one light emitting diode (LED) disposed within the package body;
wherein the at least one LED occupies an area approximately equal to 2 percent (%) or less of the package area; and
wherein the system is ENERGY STAR® compliant.

59. A method of fabricating a light emitting device package, the method comprising:
providing a package body comprising a package area;
providing at least one light emitting diode (LED); and
disposing the at least one LED within the package body where the at least one LED occupies an area approximately equal to 2 percent (%) or less of the package area;
wherein the at least one LED comprises a length of less than approximately 550 micrometers (µm).

60. The method of claim 59, wherein the package body comprises a package thickness of approximately 0.86 millimeters (mm).

61. The method of claim 59, wherein the package body comprises a cavity having a depth of approximately 0.36 millimeters (mm).

62. The method of claim 59, wherein the package comprises an electrically isolated heat transfer material.

63. The method of claim 59, wherein the heat transfer material comprises a thickness of approximately 0.5 millimeters (mm).

64. The method of claim 59, wherein the package comprises a cavity floor, and the at least one LED occupies an area less than or equal to approximately 6.5% of an area of the cavity floor.

65. The method of claim 59, wherein the package body comprises a package length of approximately 6 millimeters (mm) and a package width of approximately 3 millimeters (mm).

66. The method of claim 59, wherein the package body comprises a package length of approximately 7 millimeters (mm) and a package width of approximately 2 millimeters (mm).

67. The method of claim 59, wherein the at least one LED comprises a width of less than approximately 700 micrometers (µm).

68. The method of claim 59, wherein the at least one LED comprises a length of approximately 520 micrometers (µm) and a width of approximately 700 micrometers (µm).

69. The method of claim 59, wherein the at least one LED comprises a length of approximately 500 micrometers (µm) and a width of approximately 500 micrometers (µm).

70. The method of claim 59, wherein the at least one LED comprises a length of approximately 430 micrometers (µm) and a width of approximately 580 micrometers (µm).

71. The method of claim 59, wherein the package body comprises an upper surface disposed outside of a reflector cavity, the upper surface comprising a length of approximately 0.15 millimeters (mm).

72. The method of claim 59, wherein the at least one LED is mounted in the package body using flux-eutectic, non-eutectic, or thermal compression die attach.

73. The method of claim 59, wherein the package body comprises plastic.

74. The method of claim 59, wherein the package comprises two LEDs.

75. The method of claim 74, wherein the two LEDs are electrically connected in series.

76. The method of claim 74, wherein the two LEDs are electrically connected in parallel.

77. The method of claim 57, wherein the cavity comprises a cavity angle of approximately 135° or more.

78. The method of claim 59, wherein the cavity comprises a cavity angle of approximately 128° or more.

79. The method of claim 59, wherein the cavity comprises a cavity angle of approximately 118° or more.

80. The method of claim 59, wherein the light emitting device package is ENERGY STAR® compliant.

* * * * *